US012796044B2

(12) United States Patent
Lung et al.

(10) Patent No.: US 12,796,044 B2
(45) Date of Patent: Nov. 10, 2026

(54) ETCH SELECTIVE BOTTOM-UP DIELECTRIC FILM

(71) Applicant: Taiwan Semiconductor Manufacturing Co., Ltd., Hsinchu (TW)

(72) Inventors: Chun-Ming Lung, Hsinchu (TW); Che-Hao Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1208 days.

(21) Appl. No.: 17/558,958

(22) Filed: Dec. 22, 2021

(65) Prior Publication Data

US 2022/0352348 A1 Nov. 3, 2022

Related U.S. Application Data

(60) Provisional application No. 63/182,064, filed on Apr. 30, 2021.

(51) Int. Cl.

| | |
|---|---|
| ***H10D 64/01*** | (2025.01) |
| ***H10D 30/67*** | (2025.01) |
| ***H10D 62/10*** | (2025.01) |
| ***H10P 14/60*** | (2026.01) |
| ***H10P 50/28*** | (2026.01) |

(52) U.S. Cl.

CPC ....... *H10D 64/017* (2025.01); *H10D 30/6735* (2025.01); *H10D 30/6757* (2025.01); *H10D 62/118* (2025.01); *H10P 14/6336* (2026.01); *H10P 14/6532* (2026.01); *H10P 50/283* (2026.01)

(58) Field of Classification Search

CPC ............ H10D 64/017; H10D 30/6757; H10D 62/118; H10D 30/6735; H01L 21/02274; H01L 21/0234; H01L 21/31111

See application file for complete search history.

(56) References Cited

U.S. PATENT DOCUMENTS

| | | | |
|---|---|---|---|
| 9,209,247 | B2 | 12/2015 | Colinge et al. |
| 9,224,833 | B2 | 12/2015 | Chen et al. |
| 9,251,888 | B1 | 2/2016 | Liaw |
| 9,947,804 | B1 | 4/2018 | Frougier et al. |
| 10,672,892 | B2 | 6/2020 | Ching et al. |
| 11,469,143 | B2 | 10/2022 | Chang et al. |
| 2004/0198003 | A1 | 10/2004 | Yeo et al. |
| 2015/0048442 | A1 | 2/2015 | Colinge et al. |

(Continued)

FOREIGN PATENT DOCUMENTS

| | | |
|---|---|---|
| CN | 107104036 A | 8/2017 |
| CN | 109300973 A | 2/2019 |

(Continued)

*Primary Examiner* — Joshua Benitez Rosario
*Assistant Examiner* — Christopher A Culbert
(74) *Attorney, Agent, or Firm* — Slater Matsil, LLP

(57) ABSTRACT

Embodiments provide a treatment process to a dielectric layer deposited in a source/drain recess. The treatment process alters the etch selectivity of the horizontal portions of the dielectric layer to cause the horizontal portions of the dielectric layer to have a lower etch rate than the vertical portions of the dielectric layer. The vertical portions are removed by a wet etch process to leave a portion of the dielectric layer at a bottom of the source/drain recess.

20 Claims, 38 Drawing Sheets

(56) References Cited

U.S. PATENT DOCUMENTS

| | | | |
|---|---|---|---|
| 2015/0303270 | A1 | 10/2015 | Liaw |
| 2017/0125286 | A1 | 5/2017 | Briggs et al. |
| 2017/0243734 | A1 | 8/2017 | Ishikawa et al. |
| 2019/0067452 | A1 | 2/2019 | Cheng et al. |
| 2020/0006478 | A1 | 1/2020 | Hsu et al. |
| 2020/0168742 | A1 | 5/2020 | Wang et al. |
| 2020/0176323 | A1* | 6/2020 | Lo .................... H10D 64/01318 |
| 2020/0273757 | A1 | 8/2020 | Ng et al. |

FOREIGN PATENT DOCUMENTS

| | | | |
|---|---|---|---|
| CN | 110660849 | A | 1/2020 |
| TW | 200419802 | A | 10/2004 |
| TW | 201913817 | A | 4/2019 |
| TW | 202008503 | A | 2/2020 |

* cited by examiner

ETCH SELECTIVE BOTTOM-UP DIELECTRIC FILM

PRIORITY CLAIM AND CROSS-REFERENCE

This application claims the benefit of U.S. Provisional Application No. 63/182,064, filed on Apr. 30, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
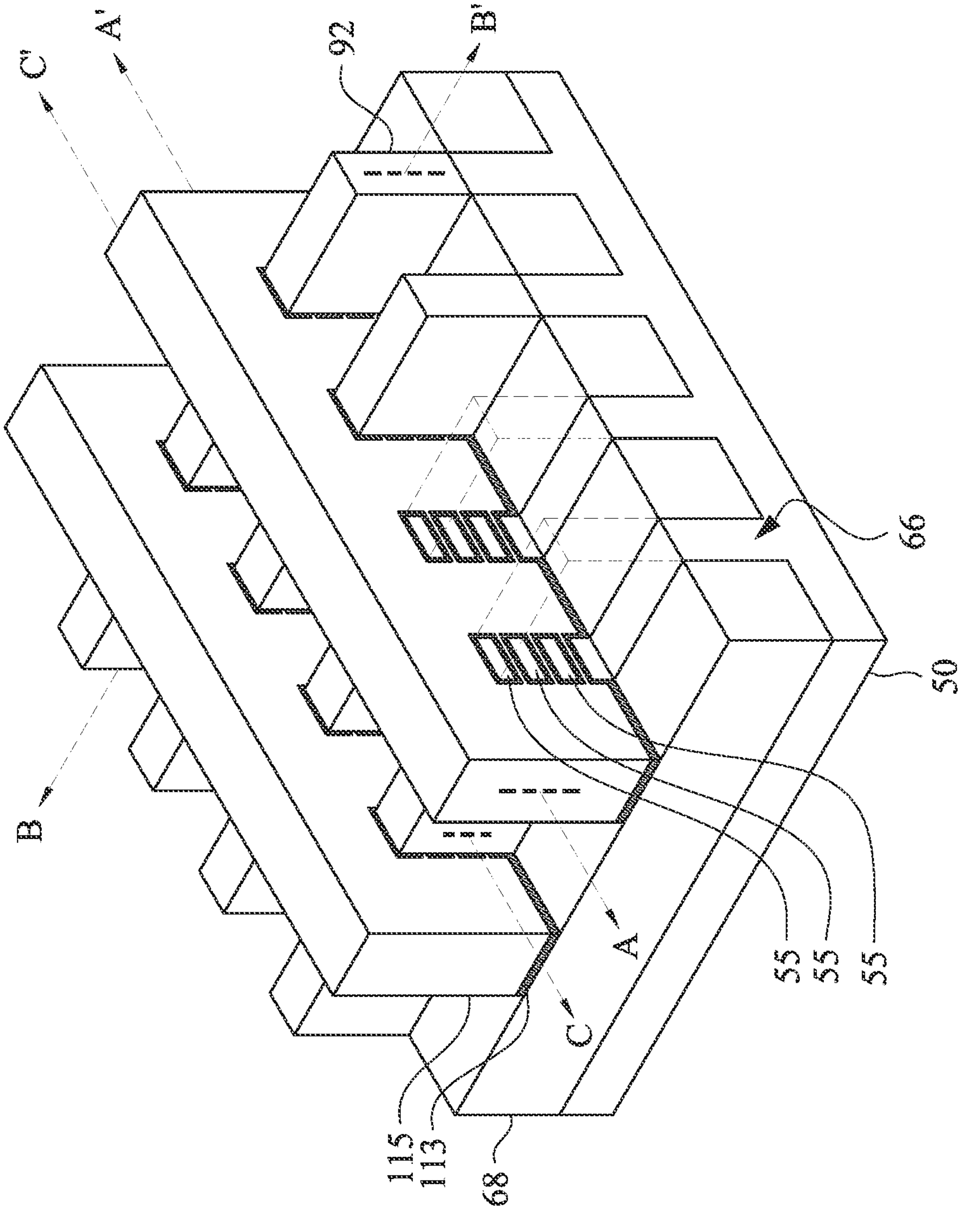
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provide a treatment to adjust the etch selectivity of a deposited dielectric layer. The treatment may be provided during and/or after a cyclical deposition process that forms the dielectric layer in a recess of a nano-FET. Following the treatment, the dielectric layer in the bottom of recess is densified and has an increased etch selectivity with respect to the same material on the sidewalls of the recess. For example, the wet etch rate of the sidewall portion of the dielectric layer may be five times that of the wet etch rate of the bottom portion of the dielectric layer. The treatment provides a plasma that causes chlorine atoms found in the dielectric layer to be substituted for hydrogen atoms.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 113 are over top surfaces of the fins 66 and along top surfaces, sidewalls, and bottom surfaces of the nanostructures 55. Gate electrodes 115 are over the gate dielectric layers 113. Epitaxial source/drain regions 92 are disposed on the fins 66 on opposing sides of the gate dielectric layers 113 and the gate electrodes 115.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 20C are cross-sectional views of intermediate stages in the manufacturing of nano-FETs, in accordance with some embodiments. FIGS. 2 through 5, 6A, 16A, 17A, 18A, 19A, and 20A illustrate reference cross-section A-A' illustrated in FIG. 1. FIGS. 6B, 7B, 8B, 9B, 10A, 10B, 11A. 11B, 13A, 13B, 14A, 14B, 15B, 16B, 17B, 18B, 19B, and 20B illustrate reference cross-section B-B' illustrated in FIG. 1. FIGS. 7A, 8A, 9A, 15A, 16C, 19C, and 20C illustrate reference cross-section C-C' illustrated in FIG. 1.

Figure 2:
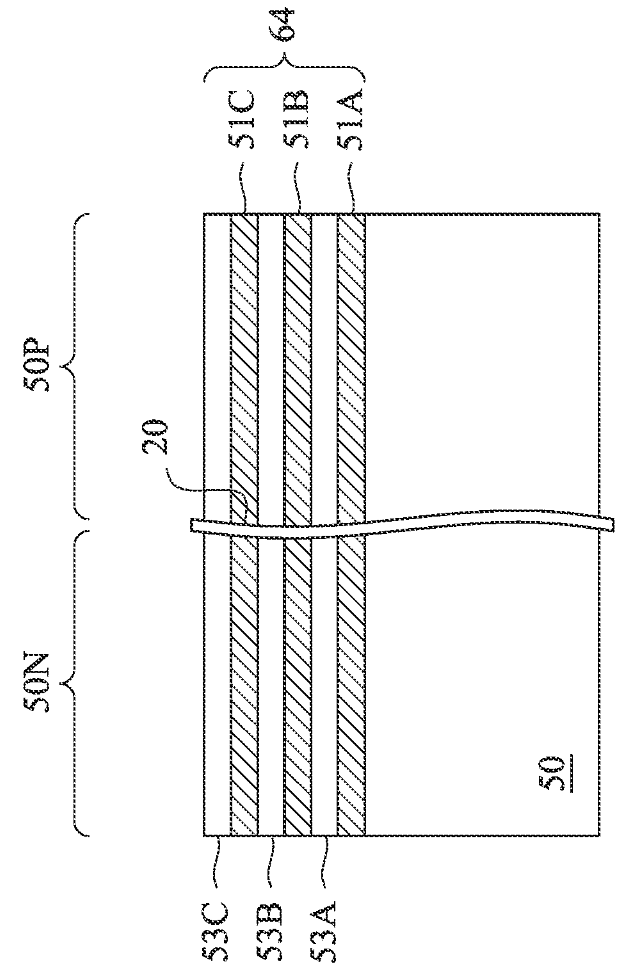
FIGS. 2, 3, 4, 5, 6A, 6B, 7A, 7B, 8A, 8B, 9A, 9B, 10A, 10B, 11A, 11B, 13A, 13B, 14A, 14B, 15A, 15B, 16A, 16B, 16C, 17A, 17B, 18A, 18B, 19A, 19B, 19C, 20A, 20B, and 20C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

Figure 21A:
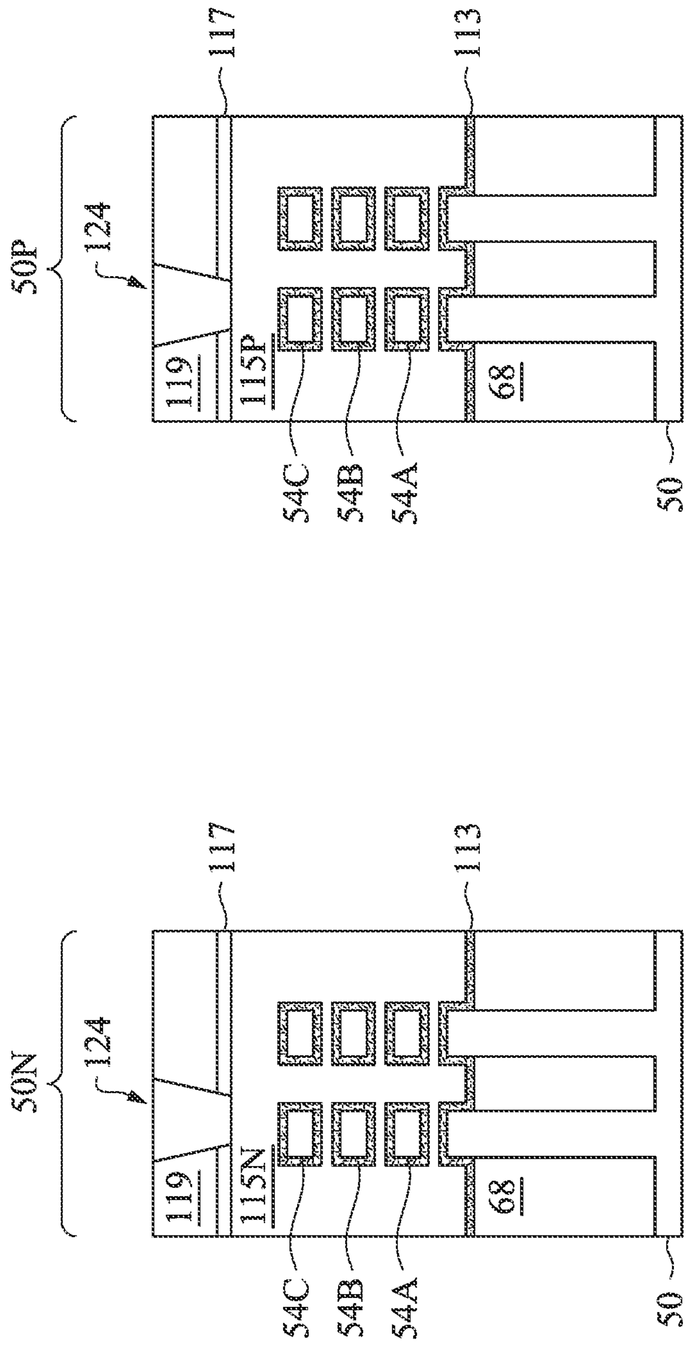
FIGS. 21A, 21B, and 21C are cross-sectional views of a nano-FET, in accordance with some embodiments.
Figure 21B:
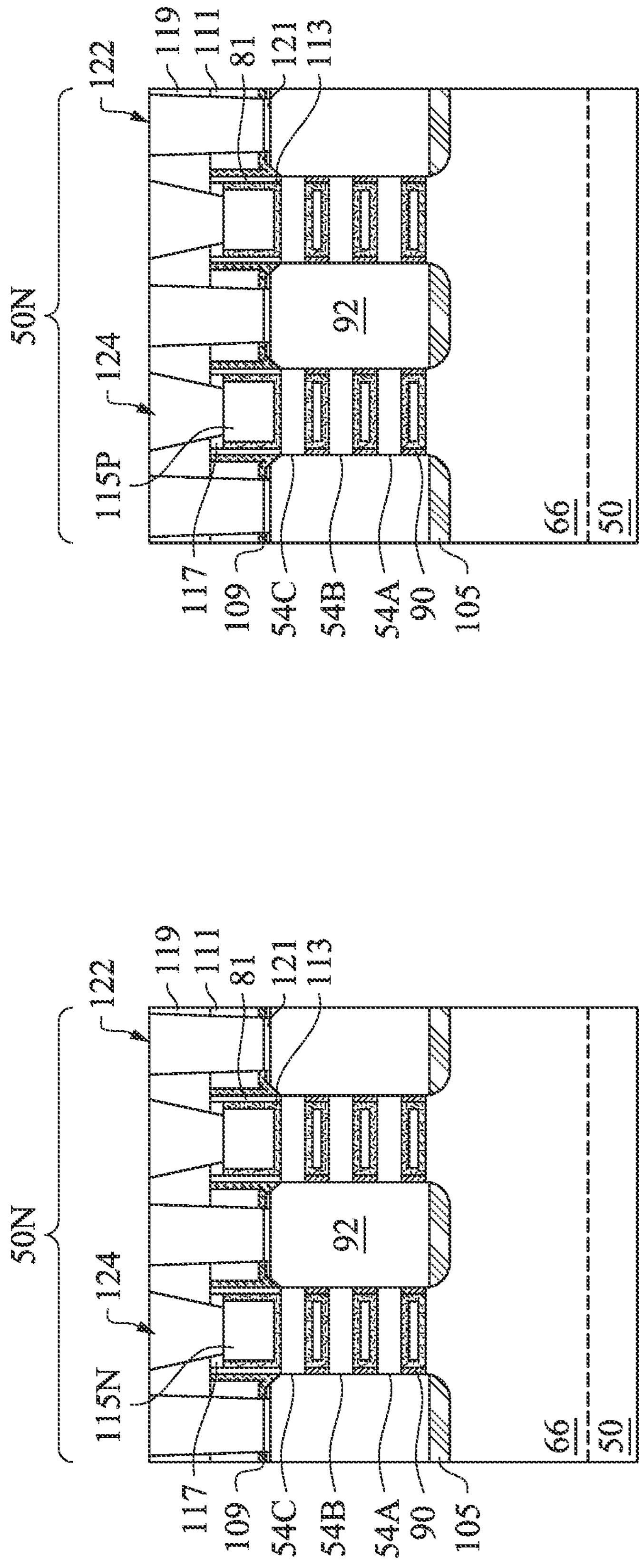
Figure 21C:
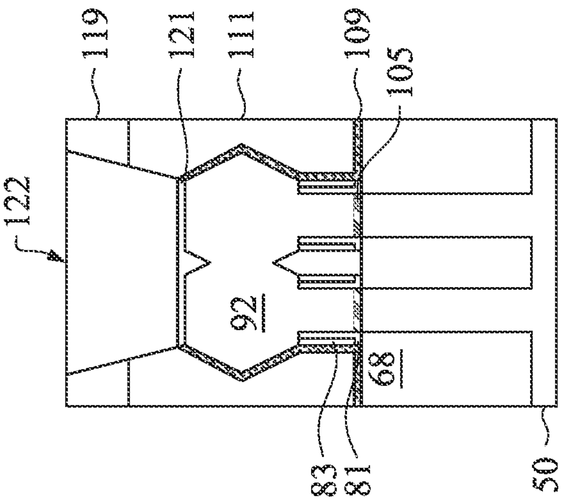

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 21A, 21B, and 21C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
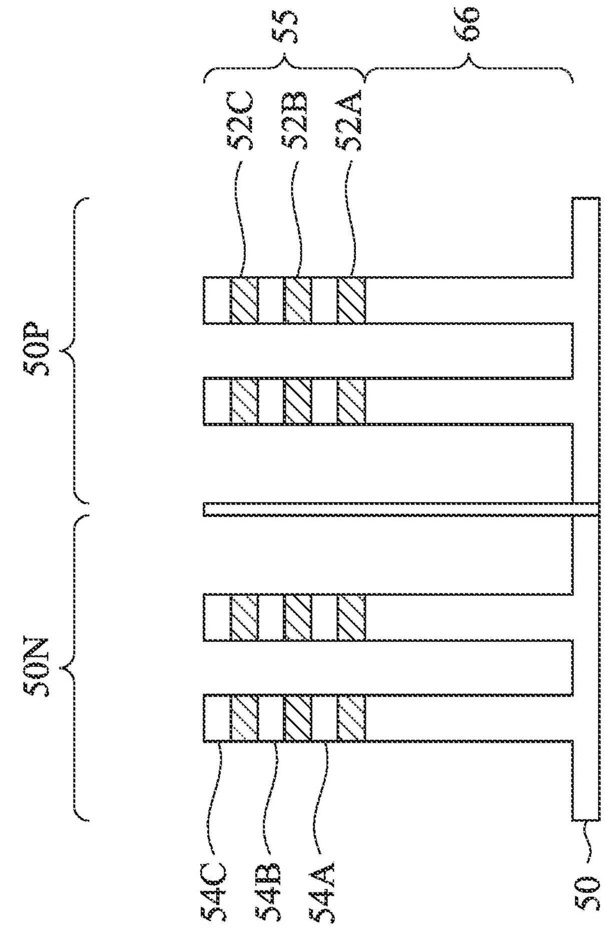

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
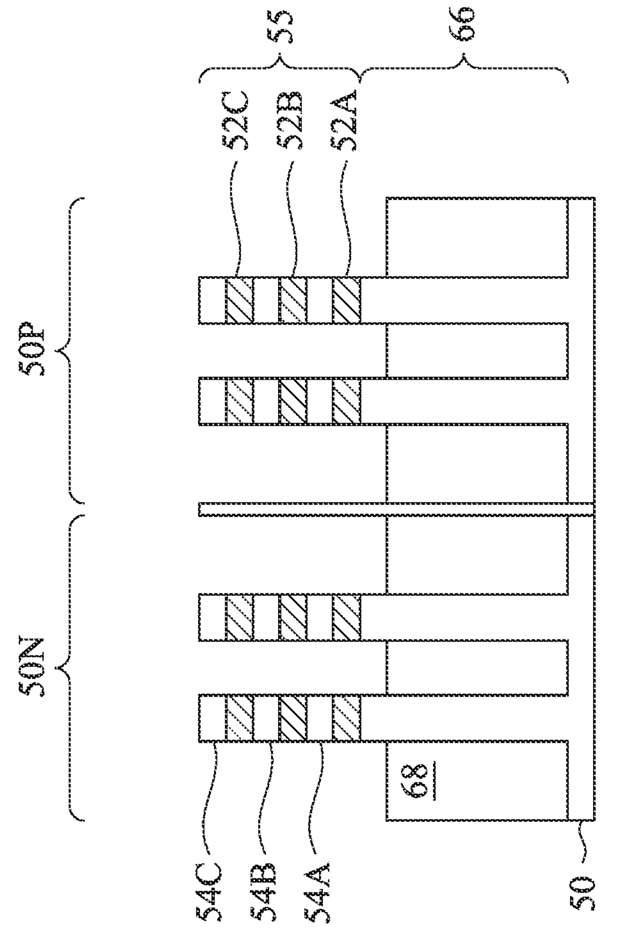

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting nanostructures 52) and the second semiconductor layers 53 (and resulting nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
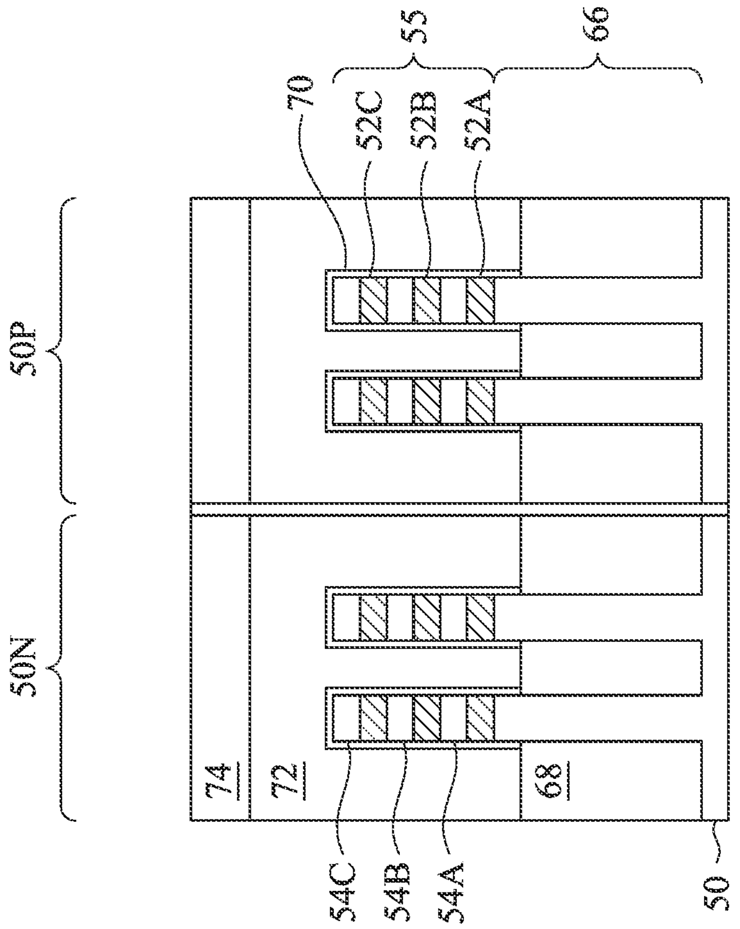

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
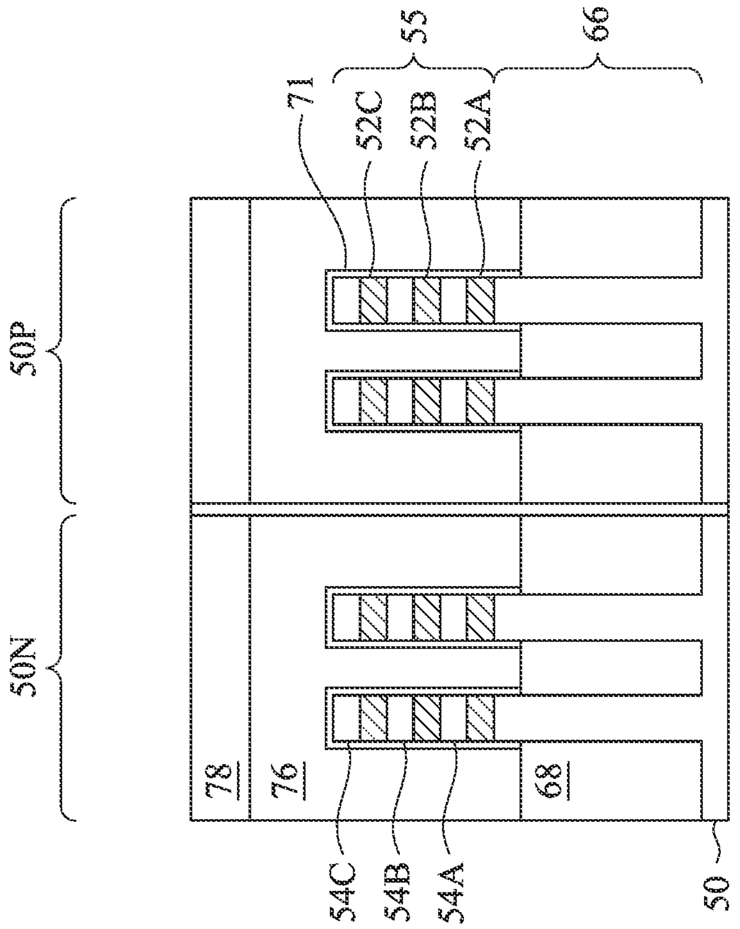
Figure 6B:
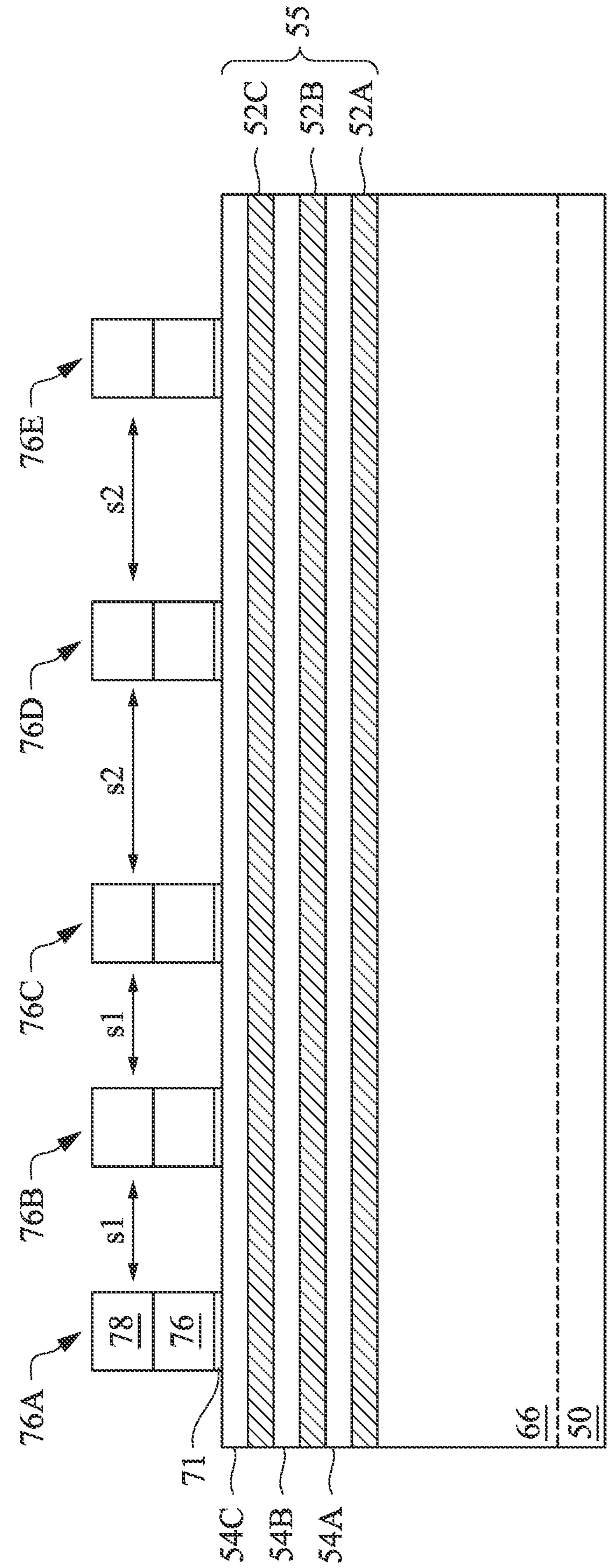

FIGS. 6A through 20C illustrate various additional steps in the manufacturing of embodiment devices. FIGS. 6B, 7A, 7B, 8A, 8B, 9A, 9B, 15A, 16A, 16C, 17A, 19C, and 20C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

In some embodiments, the spacing between each of the dummy gates 76 may be uniform, while in other embodiments, such as illustrated in FIG. 6B, the spacing between the dummy gates 76 may vary. For example, the spacing s2 between the dummy gates 76C and 76D and between the dummy gates 76D and 76E may be between about 25% and 75% larger than the spacing s1 between the dummy gates 76A and 76B and between the dummy gates 76B and 76C. In some embodiments, the spacing s2 may be between 20% and 250% larger than the spacing s1, depending on device requirements. In some embodiments, other spacing sizes may be used between the dummy gates 76. In one embodiment the spacing s1 may be between about 10 nm and about 20 nm and the spacing s2 may be between about 20 nm and 50 nm, though other values may be used. The spacing s1 and s2 (and additional spacing specifications) matter because subsequent etching and deposition processes may be affected by spacing. For example, when the spacing is wider, etching may be more effective, leading to more material removal. Similarly, when the spacing is wider, deposition may be more effective, leading to more material deposition.

Figure 7A:
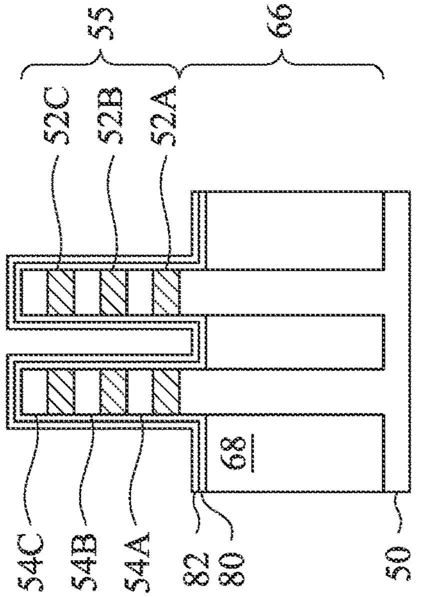
Figure 7B:
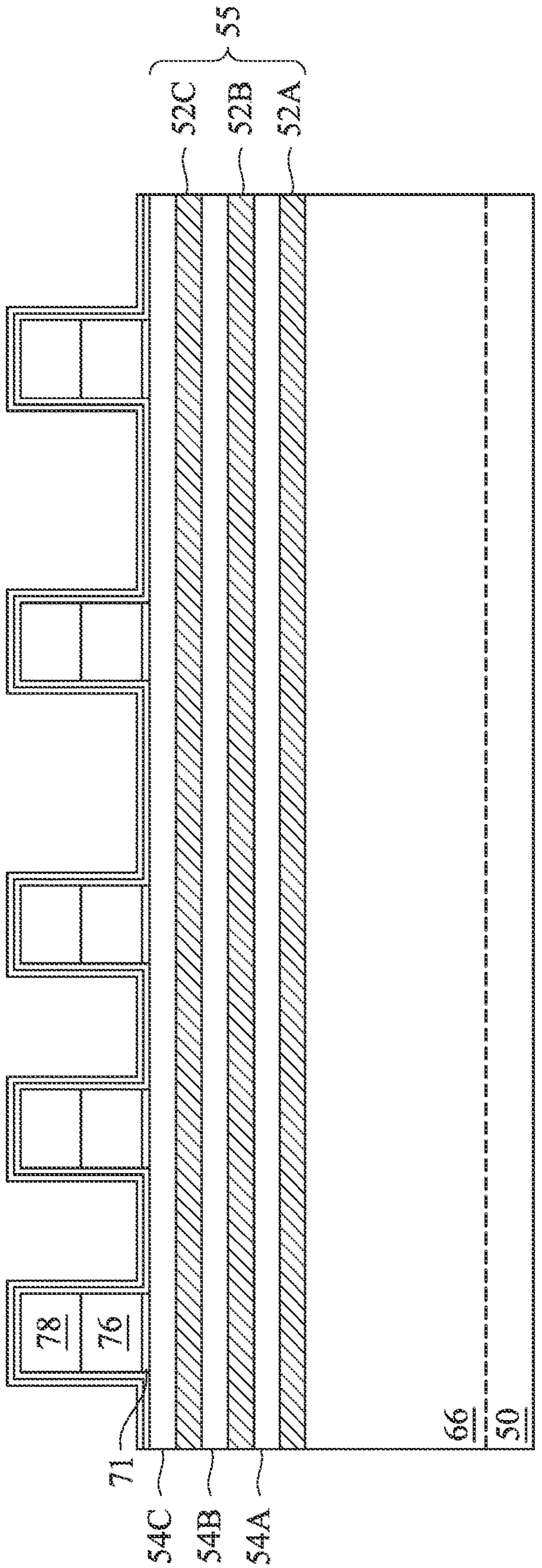

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

Figure 8A:
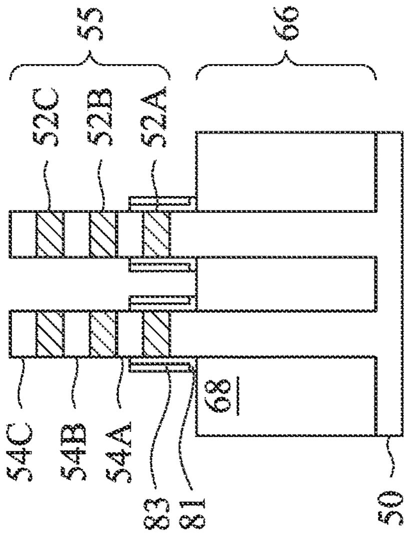
Figure 8B:
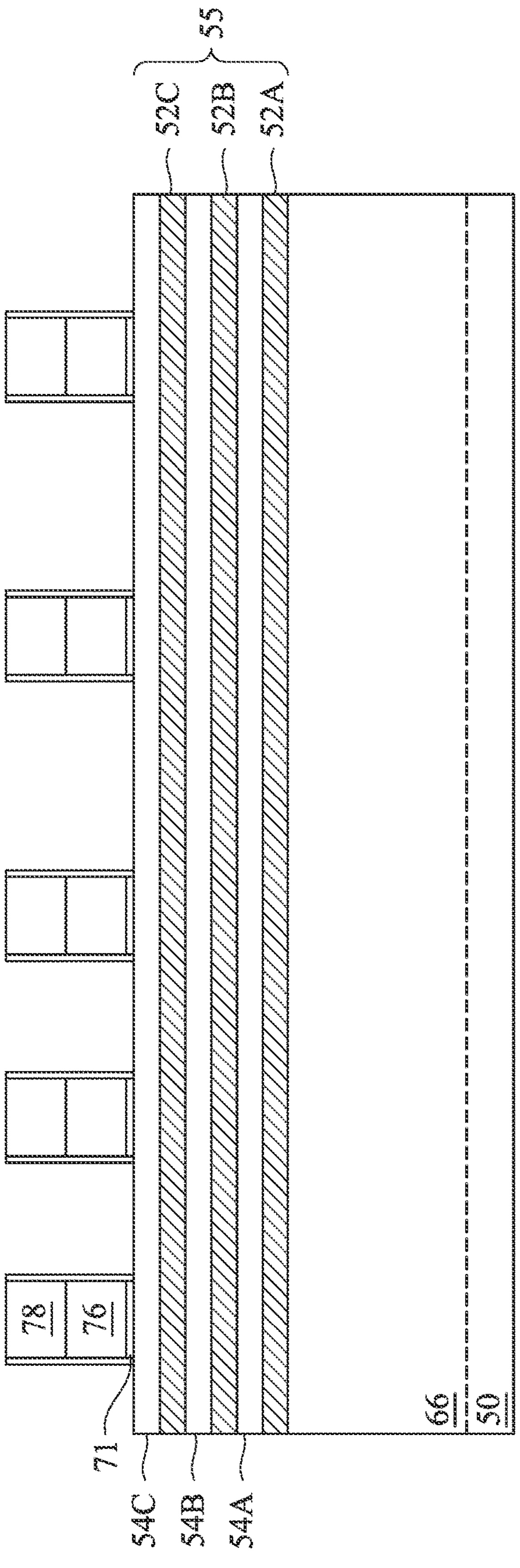

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 70. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
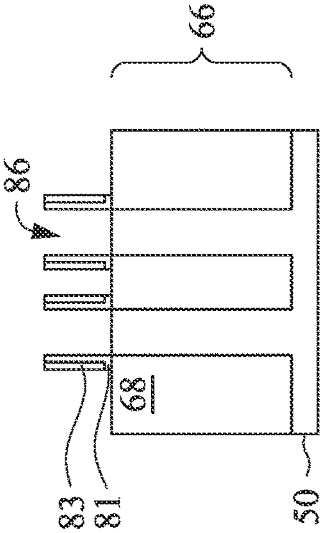
Figure 9B:
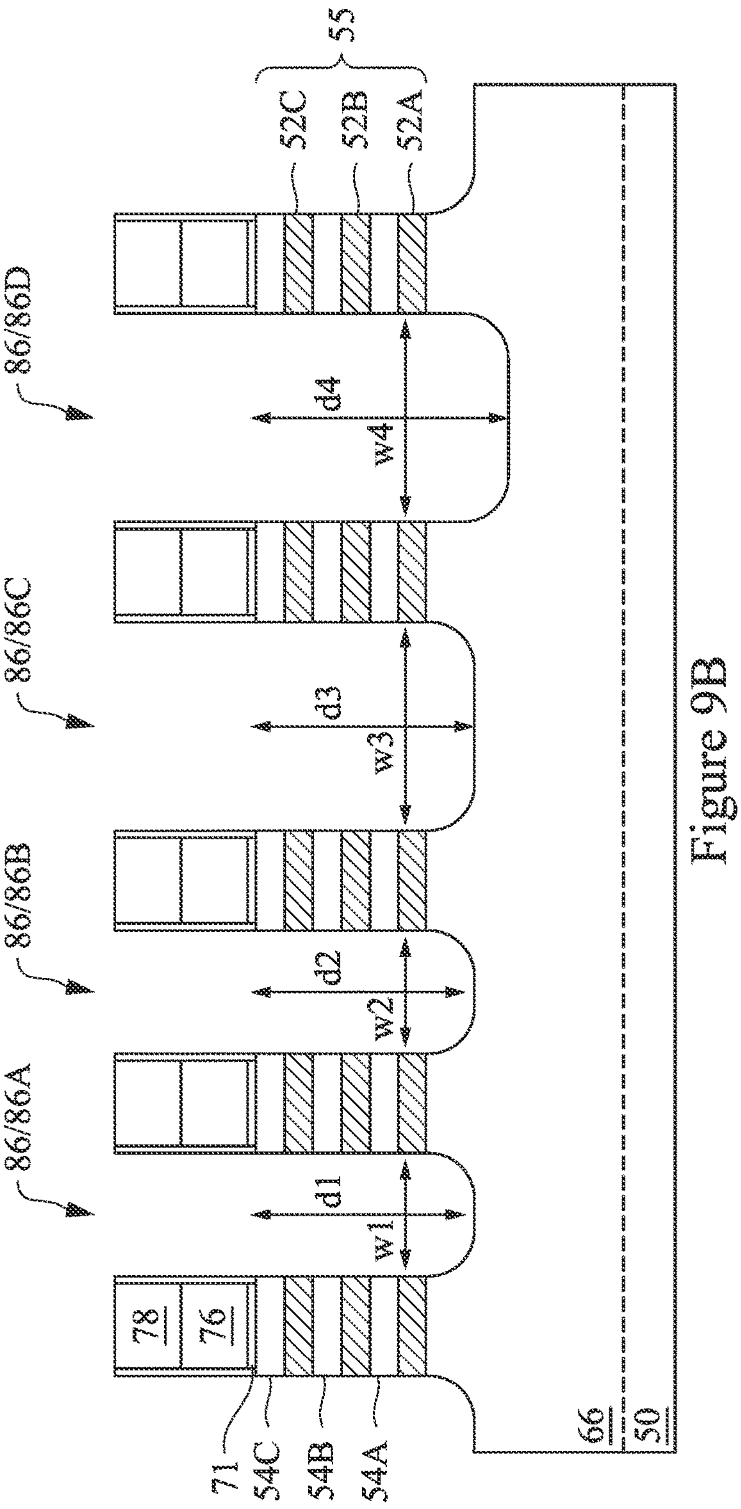

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

In some embodiments, the depths (e.g., depths d1, d2, d3, and d4) of each of the recesses 86 may be about the same. In other embodiments, one or more recesses 86 may have varying depths. For example, because the spacing s1 (see FIG. 6B) is the same for the recesses 86A and 86B the depths d1 and d2 may be the same depth as each other, and because the spacing s2 (see FIG. 6B) is the same for the recesses 86C and 86D the depths d3 and d4 may each be the same as each other. However, in some embodiments, process variations in the etching step for creating the recesses 86 may result in different depths, such as illustrated in FIG. 9B where the depth d4 is greater than the depth d3. In some embodiments, the depths d3 and d4 may each be greater than the depths d1 and d2, because the spacing s2 (see FIG. 6B) is greater than the spacing s1, resulting in more effective etch rate.

Because the etching of the recesses 86 is anisotropic, the sidewalls of the recesses 86 have good verticality. Accordingly, the width w1 and width w2 each correspond to the spacing s1 (see FIG. 6B) and the width w3 and the width w4 each correspond to the spacing s2, within process variations. In some embodiment, however, the recesses 86 may have a tapered shape, being wider at the top than at the bottom.

Figure 10A:
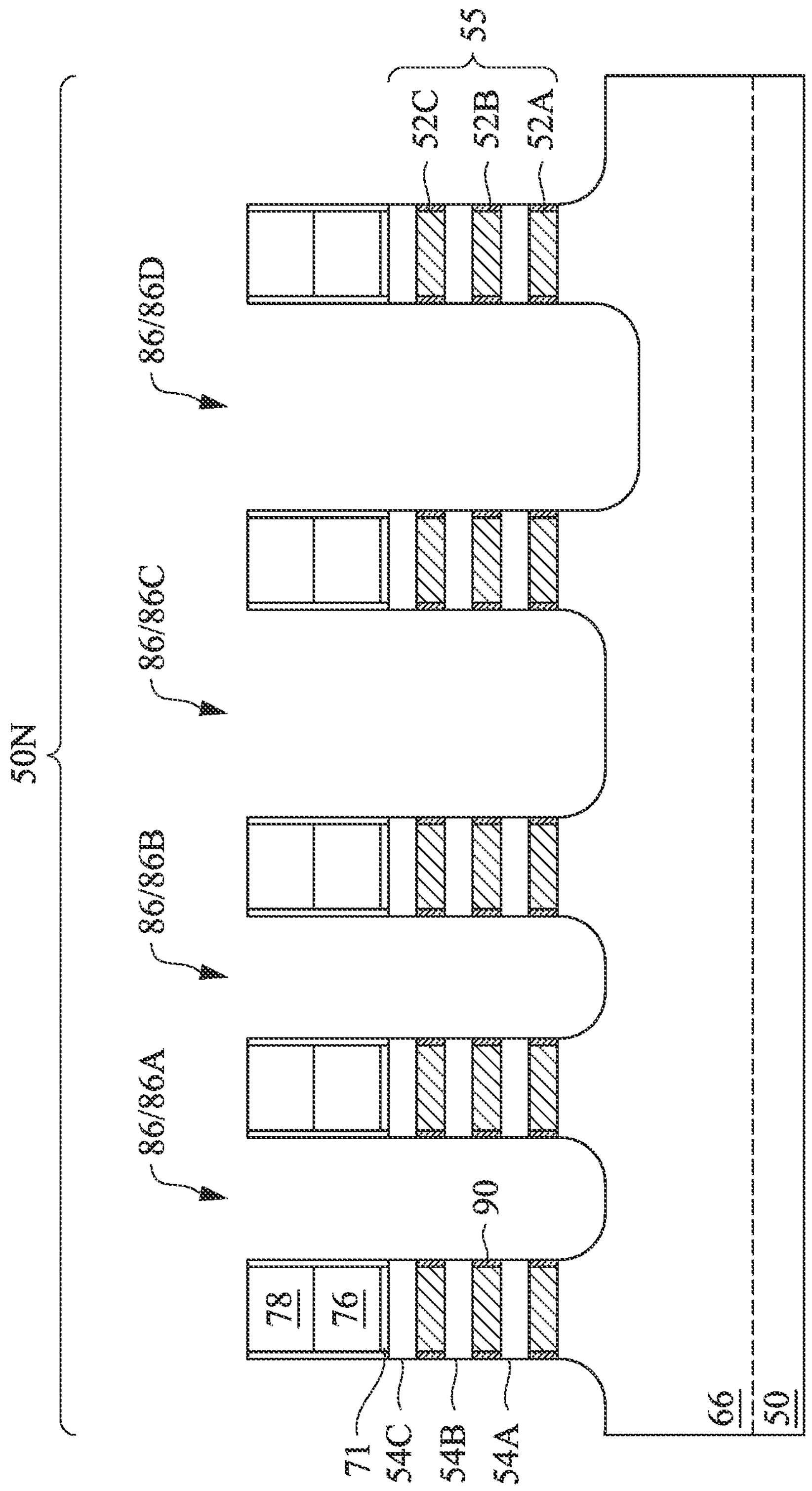
Figure 10B:
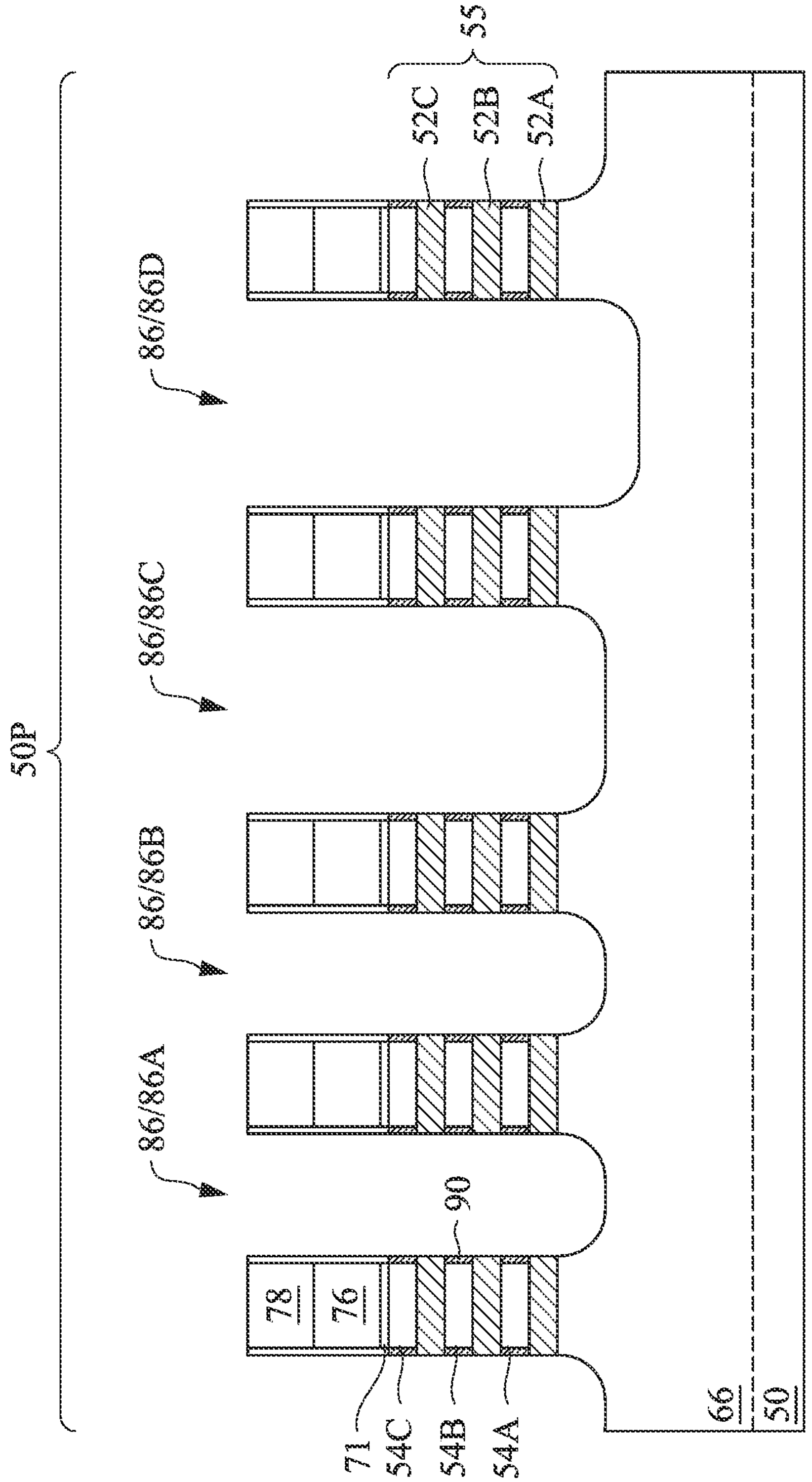

In FIGS. 10A and 10B, the region 50N and region 50P are separately illustrated. First inner spacers 90 are formed in sidewall recesses of the first nanostructures 52 in the n-type region 50N and in sidewall recess of the second nanostructures 54 in the p-type region 50P. To form the sidewall recesses, portions of sidewalls of the layers of the multi-layer stack 64 formed of the first semiconductor materials (e.g., the first nanostructures 52) exposed by the first recesses 86 are etched to form sidewall recesses in the n-type region 50N, and portions of sidewalls of the layers of the multi-layer stack 64 formed of the second semiconductor materials (e.g., the second nanostructures 54) exposed by the first recesses 86 are etched to form sidewall recesses in the p-type region 50P. Although sidewalls of the first nanostructures 52 and the second nanostructures 54 in sidewall recesses 88 are illustrated as being straight, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH4OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

The first inner spacers 90 are then formed in the sidewall recess. The first inner spacers 90 may be formed by depositing an inner spacer layer (not separately illustrated) over the dummy gates 76 and in the recesses 86, and then etching the portions outside the sidewall recesses. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 10B, the outer sidewalls of the first inner spacers 90 may be concave or convex. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 15A and 15B) by subsequent etching processes, such as etching processes used to form gate structures.

FIGS. 11A, 11B, 12A, 12B, 12C, 13A, 13B, 13C, and 14B illustrate a topography selective deposition process for forming a recess dielectric layer 105 (see FIGS. 14A and 14B) at the bottom of the recesses 86. The recess dielectric layer 105 may be formed at the bottom of the recesses 86 to provide improved current leakage control by reducing current leakage through the fins 66 and/or substrate 50 and to provide reduced fringing capacitance.

Figure 11A:
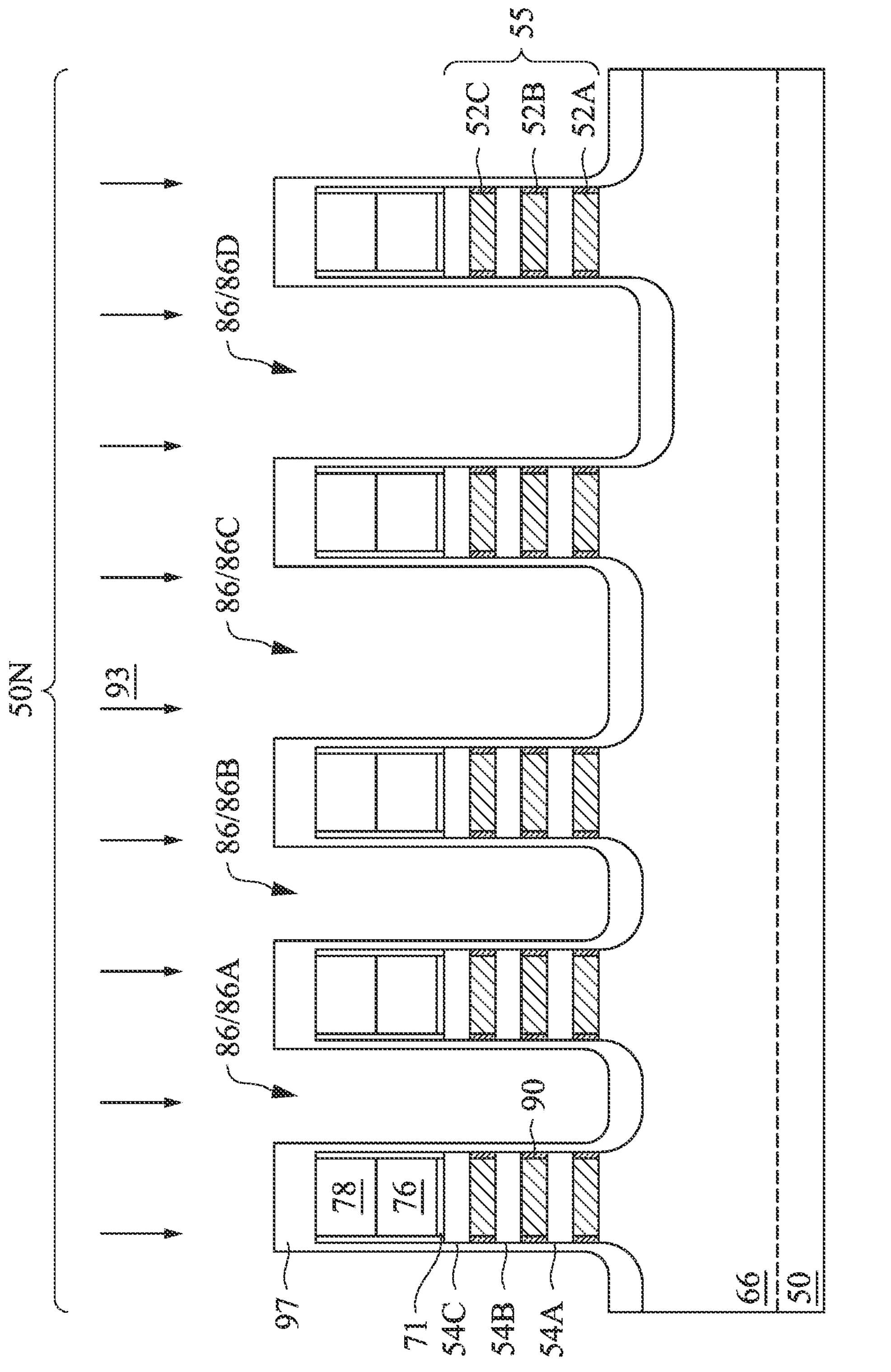
Figure 11B:
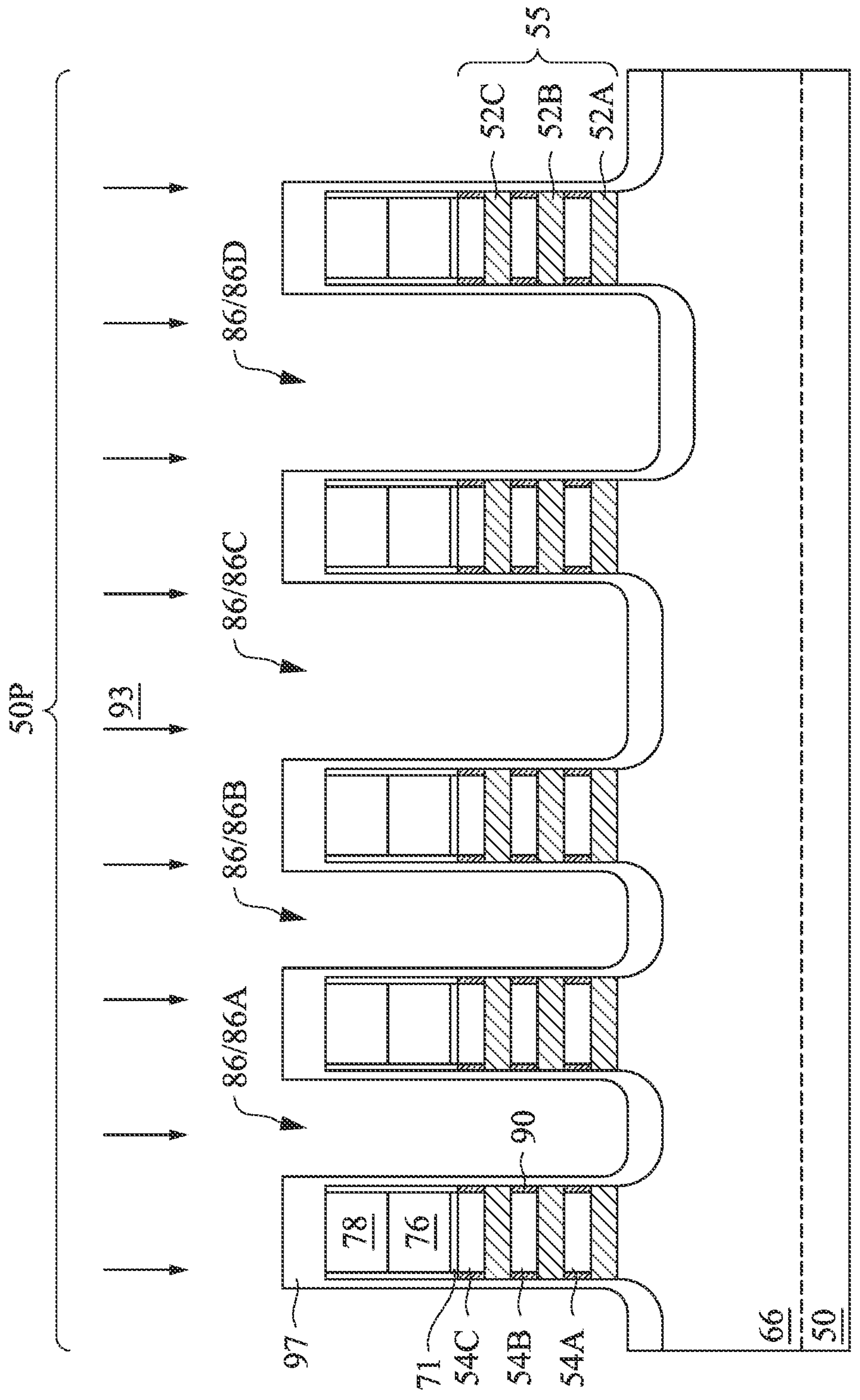

In FIGS. 11A and 11B, a dielectric layer 97 is deposited over the structures illustrated in FIGS. 10A and 10B and in the recesses 86. In some embodiments, the deposition process 93 used to form the dielectric layer 97 may be a type of plasma enhanced ALD (PEALD) process. The deposition process 93 may use a cyclical deposition process to build up the dielectric layer 97 to a desired thickness. A PEALD process is a good choice for this application because the height to width ratio of the recesses 86 may be large and a PEALD process can be used to perform a deposition which deposits at a greater rate for horizontal portions of the dielectric layer 97 (e.g., the recess 86 bottom) than on side portions of the dielectric layer 97 (e.g., the vertical portions). Even in a PEALD process, however, there is some sidewall deposition, such as illustrated in FIGS. 11A and 11B. The sidewall deposition may be removed by a wet etch, and because the bottom is relatively thicker than the sides, some of the bottom material may remain after the side material is removed. This is rather inefficient, however, because much material is wasted in an already time and resource consuming deposition process. To provide etch selectivity between the sides and bottom of the dielectric layer 97, a treatment process 99 (see FIGS. 12B and 13C) is used on the dielectric layer 97 which alters the etch selectivity of the bottom of the dielectric layer 97 with respect to the sides of the dielectric layer 97.

Figure 12A:
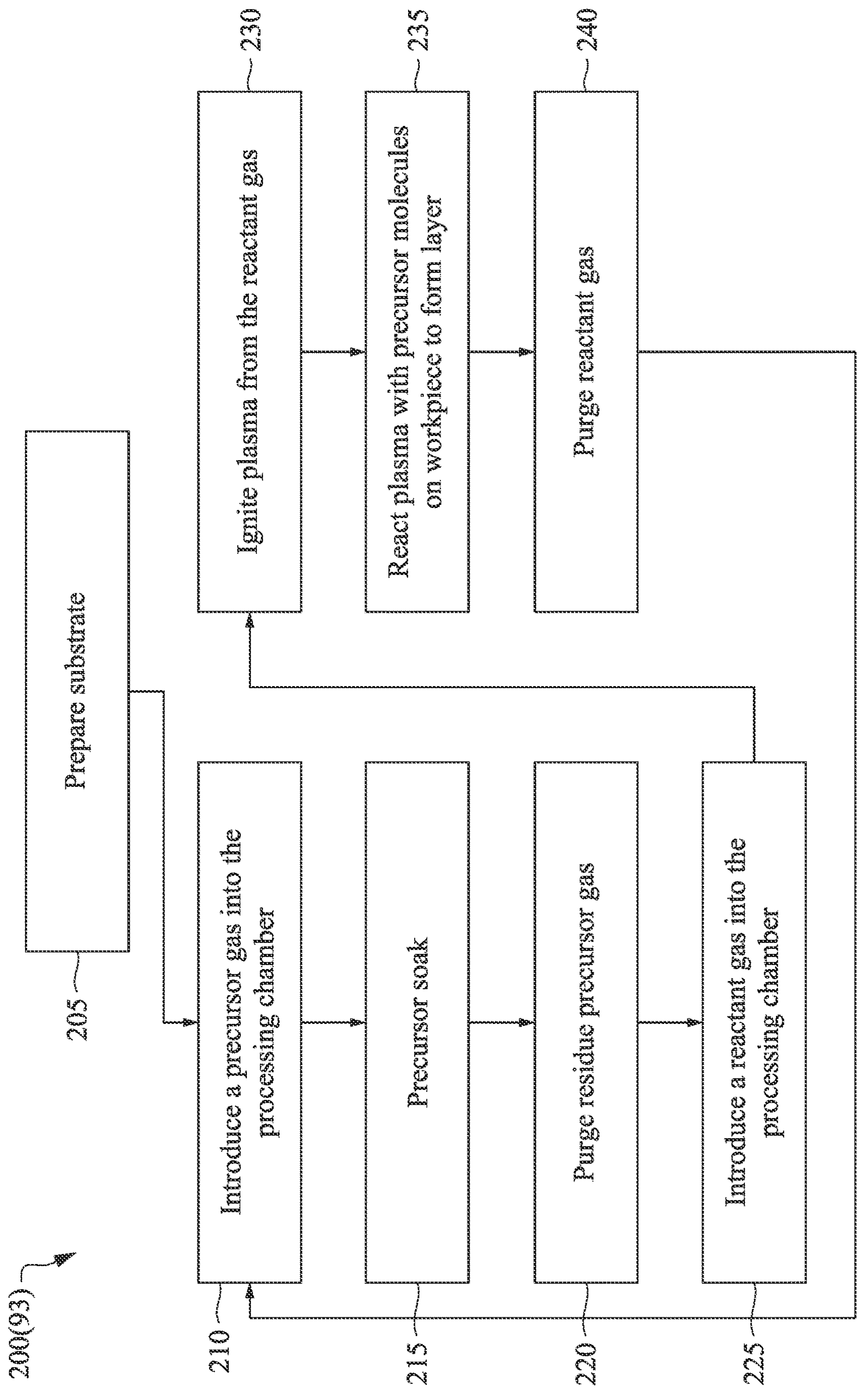
FIGS. 12A, 12B, and 12C illustrate a deposition and treatment process flow that may be utilized, in accordance with some embodiments.

Turning to FIG. 12A, flow diagram 200 for the deposition process 93 is illustrated. The PEALD flow diagram 200 is described for depositing a silicon nitride thin film. Other types of thin films can be used, such as aluminum oxide, silicon oxide, silicon carbide, silicon oxycarbide, silicon oxynitride, silicon oxycarbonitride, a low-k dielectric material, or the like. One of skill in the art will understand how to substitute materials and process gasses appropriately to form such material layers. In addition, the discussion below focuses on deposition using a dichlorosilane (DCS, $SiH_2Cl_2$) precursor and an ammonia ($NH_3$) reactant. One of skill in the art will understand that other precursors and/or reactants may be used. For example, in some embodiments, the precursor may include any suitable nitrogen-based chlorine containing gas. For example, in some embodiments, pentachlorodisilane (PCDS, $HSi_2Cl_5$), hexachlorodisilane (HCDS, $Si_2C_{16}$), or hexachlorodisilane (HCDS, $Si_2C_{16}$)+methylamine ($CH_3NH_2$) may be used. Other precursors may also be used or the process below may be modified to achieve a similar result. For example, in some embodiments diiodosilane ($SiH_2I_2$) may be used as a precursor. In some embodiments, other reactants may include nitrogen ($N_2$) and/or ammonia, which may further be combined with hydrogen ($H_2$) and/or argon (Ar). For example, in some embodiments, the reactant gas may include nitrogen, ammonia, nitrogen and ammonia, nitrogen and hydrogen, nitrogen and argon, ammonia and argon, ammonia and hydrogen, or nitrogen, ammonia, nitrogen, and hydrogen.

First, at the flow element 205, the substrate base or base layer is prepared. In this case, the substrate base includes multiple surface types based on their structure, such as the gate spacer 71, the first nanostructures 52, the second nanostructures 54, the first inner spacers 90, and the fins 66 (or substrate 50). The substrate base is prepared by forming amino radicals at the surfaces of the respective structures. The amino radicals may include azanide ($NH_2$) and/or imidogen (NH). These are radicals of nitrogen and hydrogen and may be formed by inserting ammonia gas or a combination of nitrogen and hydrogen gasses into the processing chamber and creating a plasma from the gas to form radicals. The radicals are highly reactive and when they strike the substrate surfaces they form bonds with the various materials of the substrate base.

At flow element 210, a precursor gas is introduced into the processing chamber. As noted above, the precursor gas may be DCS or another suitable gas. At process flow element 215, the precursor gas will soak the substrate base and may attach to the amino radicals of the substrate base. In some embodiments, the precursor gas may be ionized and the substrate base may be biased. The bias on the workpiece will cause the ions of the precursor gas to be attracted to the workpiece. Further, the bias voltage will cause more ions per square nm to be attracted to the bottoms of the recesses 86 rather than the sides of the recesses 86, resulting in a denser application of the ions for the bottom of the recesses 86 than the sides. Because the tops of the dummy gates 76 are closest to the ion source, they will experience the densest application of ions.

At process flow element 220, the residue precursor gas is purged, using a carrier gas, such as argon or another non-reactive gas. Next, at process flow element 225 the reactant gas is introduced into the processing chamber. As noted above the reactant gas can be any suitable gas, such as those discussed above. At process flow element 230, while the reactant gas is supplied, a plasma is formed from the reactant gas.

An RF power supply and an RF antenna may be used to ignite a plasma from the reactant gas to form ions of the reactant gas. The RF power supply may be configured to generate an RF signal operating at a set frequency (e.g., 13.56 MHz), which transfers energy from the RF power supply, by the RF antenna, to the precursor gas within the processing chamber. When sufficient power has been delivered to the reactant gas, a plasma is ignited. The reactant gas may be provided at a flow rate of about 1 sccm to about 10 sccm. The RF may be between about 400 kHz to about 60 MHz, such as about 430 kHz for a low frequency RF and about 13.56 MHz for a high frequency RF. The ion speed and ion travel distance can be controlled by the frequency used. For example, at 430 kHz the ion speed may be about $5.0\times10^4$ m/s and the max travel distance may be about $1.0\times10^4$ μm. At 13.56 MHz, the ion speed may be about $1.0\times10^3$ m/s and the max travel distance may be about $1.0\times10^1$ μm. Thus, the lower the frequency the greater the ion speed and travel distance, resulting in greater ion energy supplied to the recesses 86. The pressure used in the processing chamber may be between about 1 torr and about 3 torr. These and other process variables may be controlled to achieve a desired film thickness profile between the sidewalls and the bottom of the dielectric layer 97.

Using a plasma of the reactant gas allows for the process temperature to be lower as well as the process pressures, than if a plasma was not used. The process gas also becomes more reactive and results in a thicker deposition per cycle. At process flow element 235, the reactant plasma reacts with the precursor and forms a deposition layer. Because the precursor is denser at the bottoms of the recesses 86 than the sides, the resulting deposition layer is thicker at the bottom of the recesses 86 than the sides. As noted above, the ions are densest on the tops of the dummy gates 76, resulting in the thickest realized deposition layer.

At process flow element 240, the reactant gas is purged and the flow can continue back to process flow element 210 to run additional deposition cycles until a desired thickness for the dielectric layer 97 is met. If the desired thickness is met, then the process of forming the nanoFET can continue by treating the dielectric layer 97 as described in further detail below. Using the deposition process 93 provides good uniformity of the thicknesses of the various portions of the dielectric layer 97. For example, in some embodiments, the thickness of the sidewall portion of the dielectric layer 97 may be between about 1 nm and 3 nm, the thicknesses of the bottom portion of the dielectric layer 97 may be between about 4 nm and 7 nm, and the thicknesses of the upper portion (over the dummy gates 76) of the dielectric layer 97 may be between about 4 nm and about 7 nm, though other values may be used. In general a ratio of the thicknesses of the sidewall portions to the bottom portions to the upper portions of the dielectric layer 97 may be between about 1:2:3 and 1:4:6.

Figure 12B:
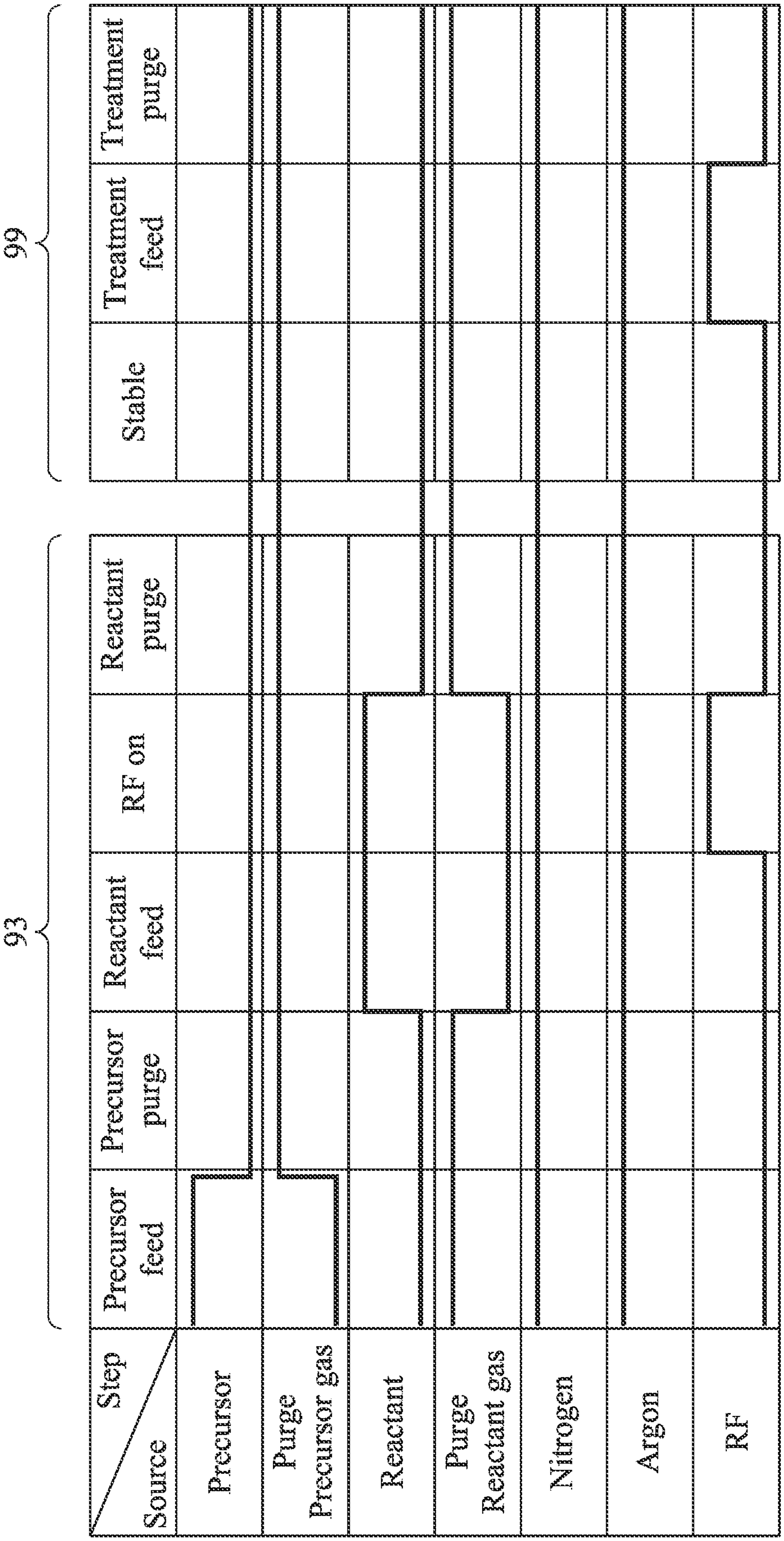

FIG. 12B illustrates a timing diagram of the deposition process 93 and the treatment process 99, which is discussed in detail below. As seen in the timing diagram of FIG. 12B, the precursor gas is supplied in the precursor feed step (illustrated as the flow element 210). At the precursor purge step, the precursor gas is stopped and the purge gas is supplied for the precursor gas (illustrated as the flow element 220). At the reactant feed step, the reactant gas is supplied (illustrated as the flow element 225). Then the RF is turned on to generate the plasma from the reactant gas (illustrated as the flow element 230). Then, in the reactant purge step, the RF is turned off, the reactant gas is stopped and the reactant purge gas is supplied (illustrated as the flow element 240).

In the treatment process 99, the nitrogen (or another suitable gas) is ignited into a plasma by turning on the RF source during the treatment feed step. The treatment purge step turns off the RF source and the process gasses continue to flow until the plasma radicals are purged.

Figure 12C:
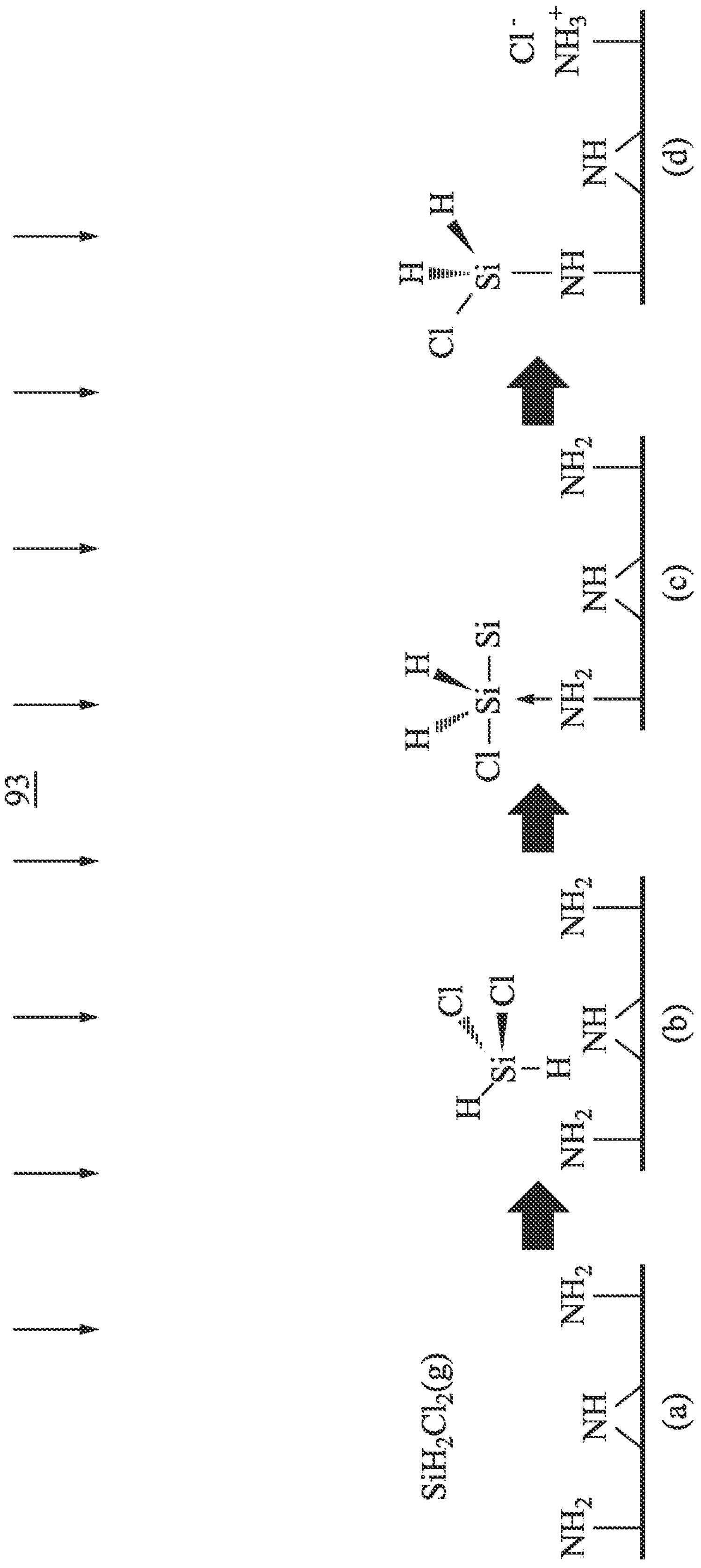

FIG. 12C illustrates a visual representation of the reactive elements occurring during a cycle of the deposition process 93. In FIG. 12C item (a) the prepared substrate shows available amino groups adsorbed on the surface of the substrate. At FIG. 12C item (b) the precursor gas is supplied, and at FIG. 12C item (c) the precursor gas bonds with the amino groups. At FIG. 12C item (d) the reactant gas is supplied and made into a plasma, resulting in the structure illustrated in FIG. 12C item (d). As seen in FIG. 12C item (d), a silicon nitride network is formed, through the deposition process 93/200, however, some of the network will contain residual chlorine atoms taking the place of some of the hydrogen atoms, especially at the surface of the deposited dielectric layer 97. The $Cl^-$ and $NH_3^+$ can form ammonia, chlorine, or chlorimide byproducts, which can be removed. In embodiments using other precursors, such as diiodosilane, the Cl is replaced by I, and references to chlorine as used in this disclosure should be replaced with references to iodine.

Figure 13A:
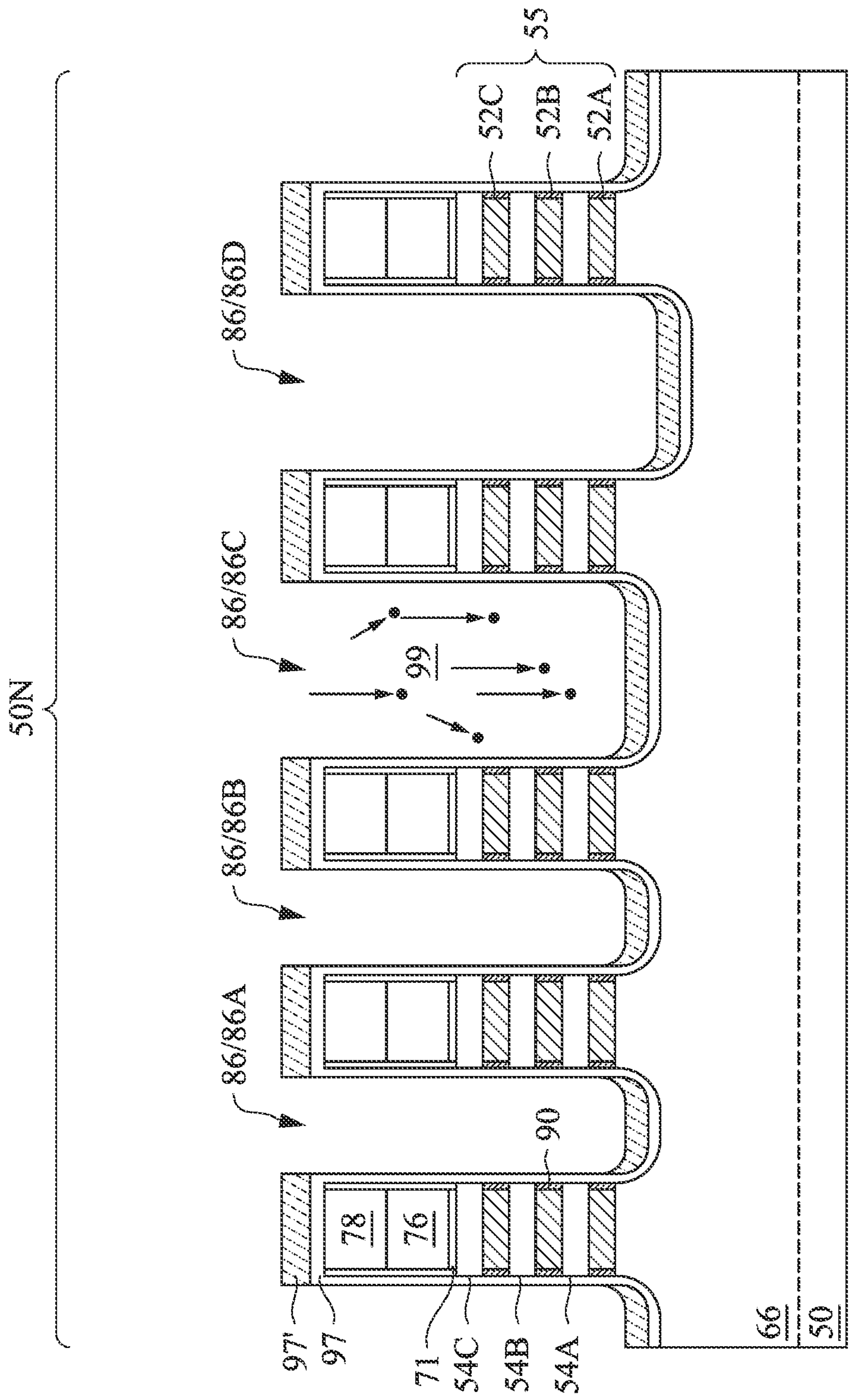
Figure 13B:
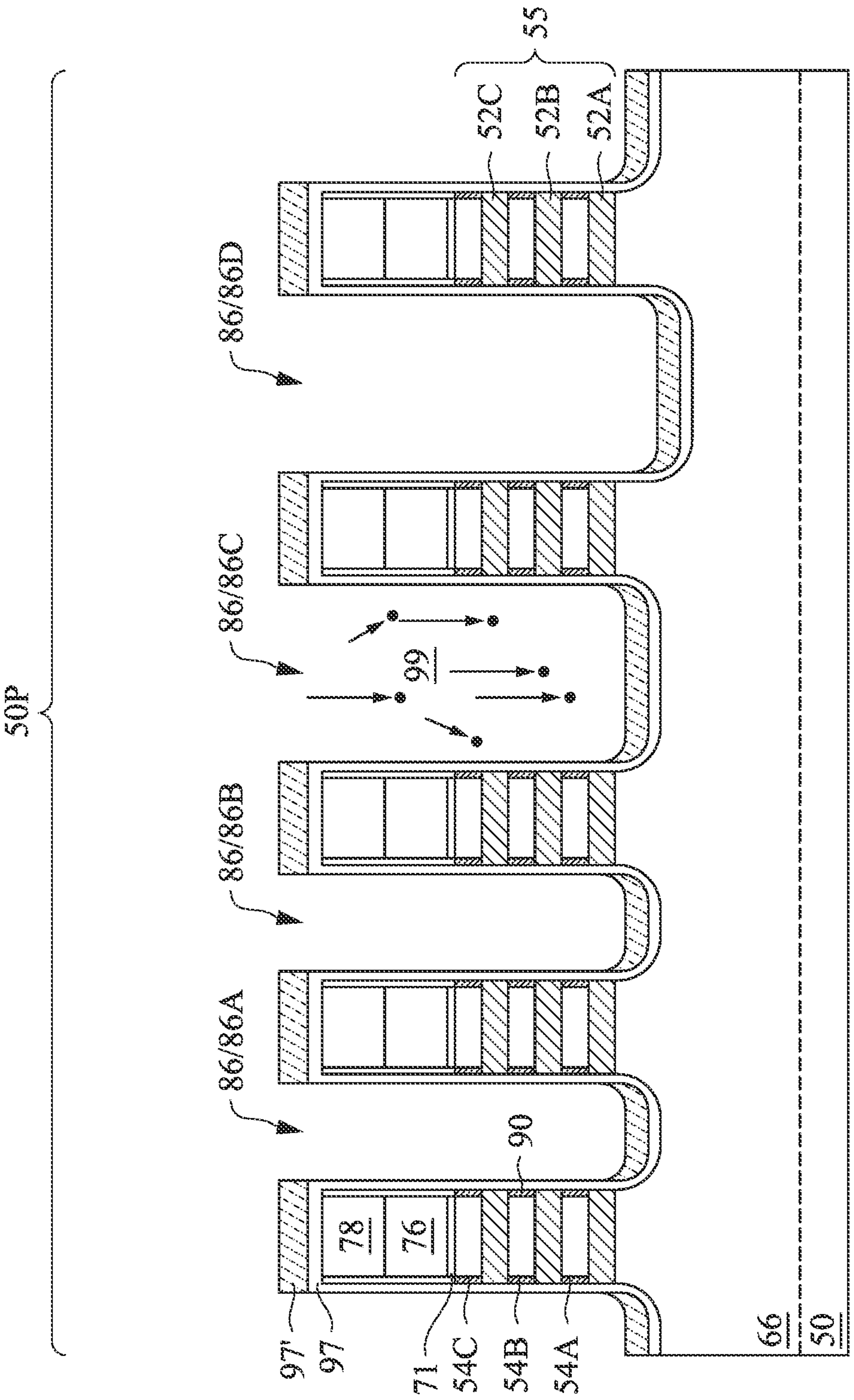
Figure 13C:
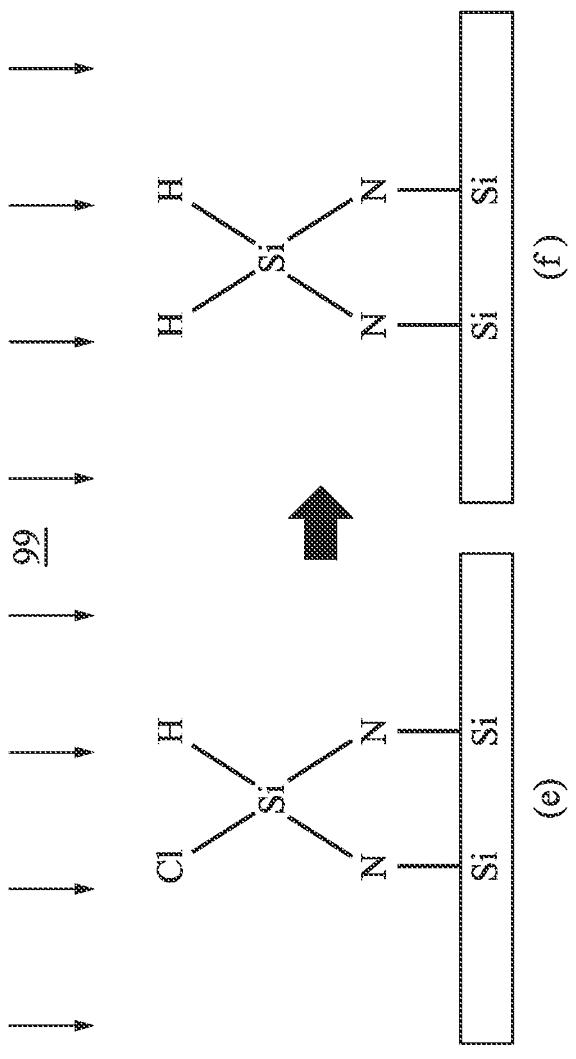
FIG. 13C illustrates a treatment process, in accordance with some embodiments.

In FIGS. 13A, 13B, and 13C, a treatment process 99 is performed to remove some of the chlorine atoms and replace them with hydrogen atoms. The treatment process is more effective on the horizontal portions of the dielectric layer 97, forming treated portions 97' of the dielectric layer 97. The presence of the chlorine atoms affects the etch rate of the dielectric layer 97 as deposited. By removing some of the chlorine atoms in certain areas of the dielectric layer 97 versus other areas of the dielectric layer 97, the etch rate can be selectively altered. FIGS. 13A and 13B illustrate the treatment process 99 as applied to the structures of FIGS. 11A and 11B.

The treatment process 99 includes providing a process gas of nitrogen (and optionally argon) to the processing chamber and igniting the process gas to create plasma of the process gas. The plasma may be ignited using a process similar to that discussed above with respect to the precursor gas. The horizontal surfaces of the dielectric layer 97 will receive a greater exposure to the plasma than the vertical surfaces. The plasma causes the chlorine bonds on the dielectric layer 97 to dissociate which will be spontaneously substituted with more reactive hydrogen atoms. The removed chlorine can be purged from the processing chamber. As a result of the treatment process 99, the horizontal portions of the dielectric layer 97 become densified with respect to the sidewall portions of the dielectric layer 97, causing a difference in etch rate between the two portions of the same structure.

FIG. 13C illustrates a visual representation of the result of the treatment process 99. FIG. 13C item (e) illustrates an untreated portion of the dielectric layer 97 after deposition and FIG. 13C item (f) illustrates the same portion post-treatment by the treatment process 99. As seen in FIG. 13C item (f), the chlorine atom is replaced with a hydrogen atom, causing the structure to become denser. In some embodiments, following the treatment process 99, the amount of chlorine in the sidewalls of the dielectric layer 97 is between about 0.6% and 0.8% (by atomic percent) and the amount of chlorine in the bottom of the dielectric layer 97 is between about 0.3% and 0.5%, and a difference between the two may be about 0.2% to 0.5%.

Figure 14A:
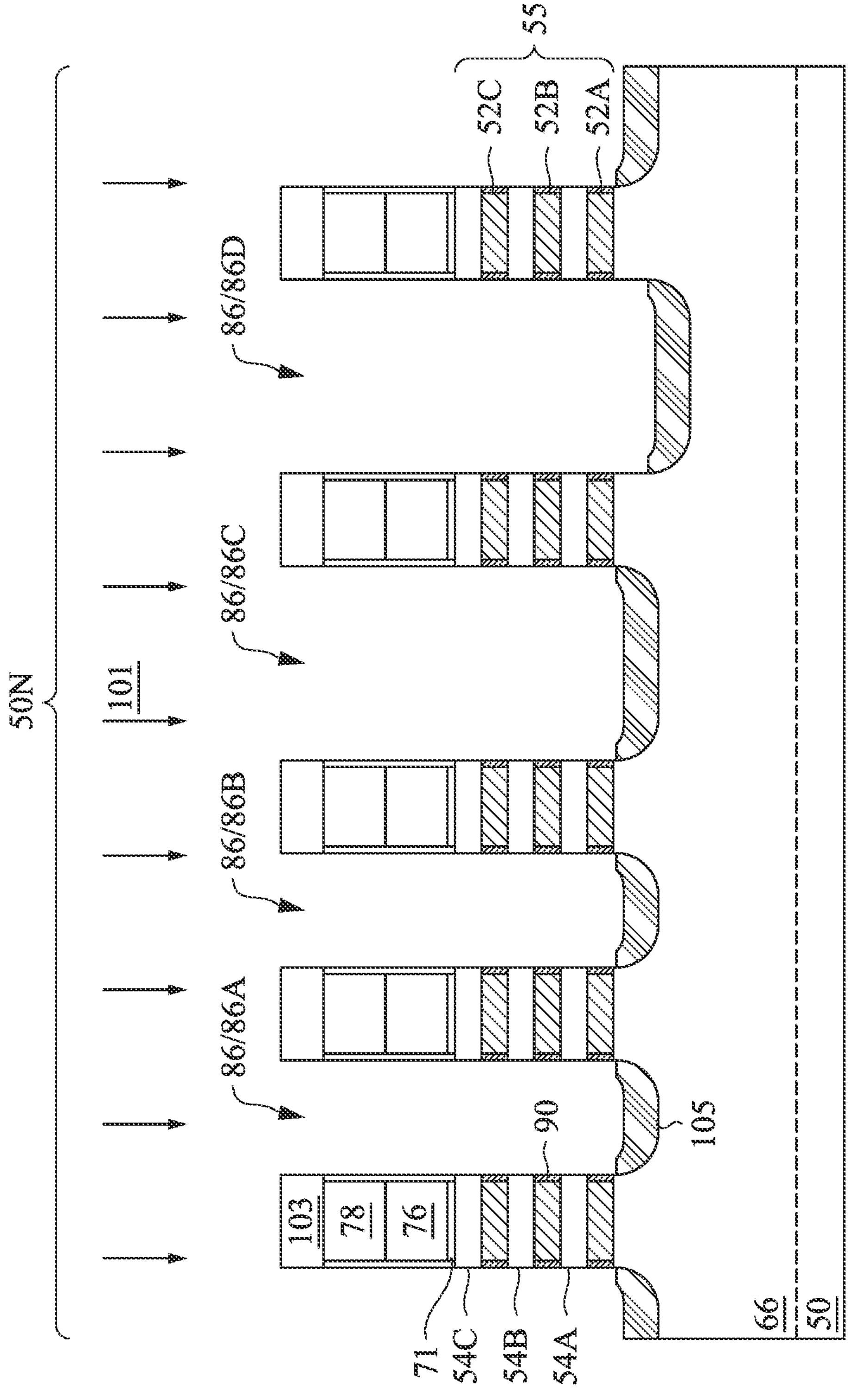
Figure 14B:
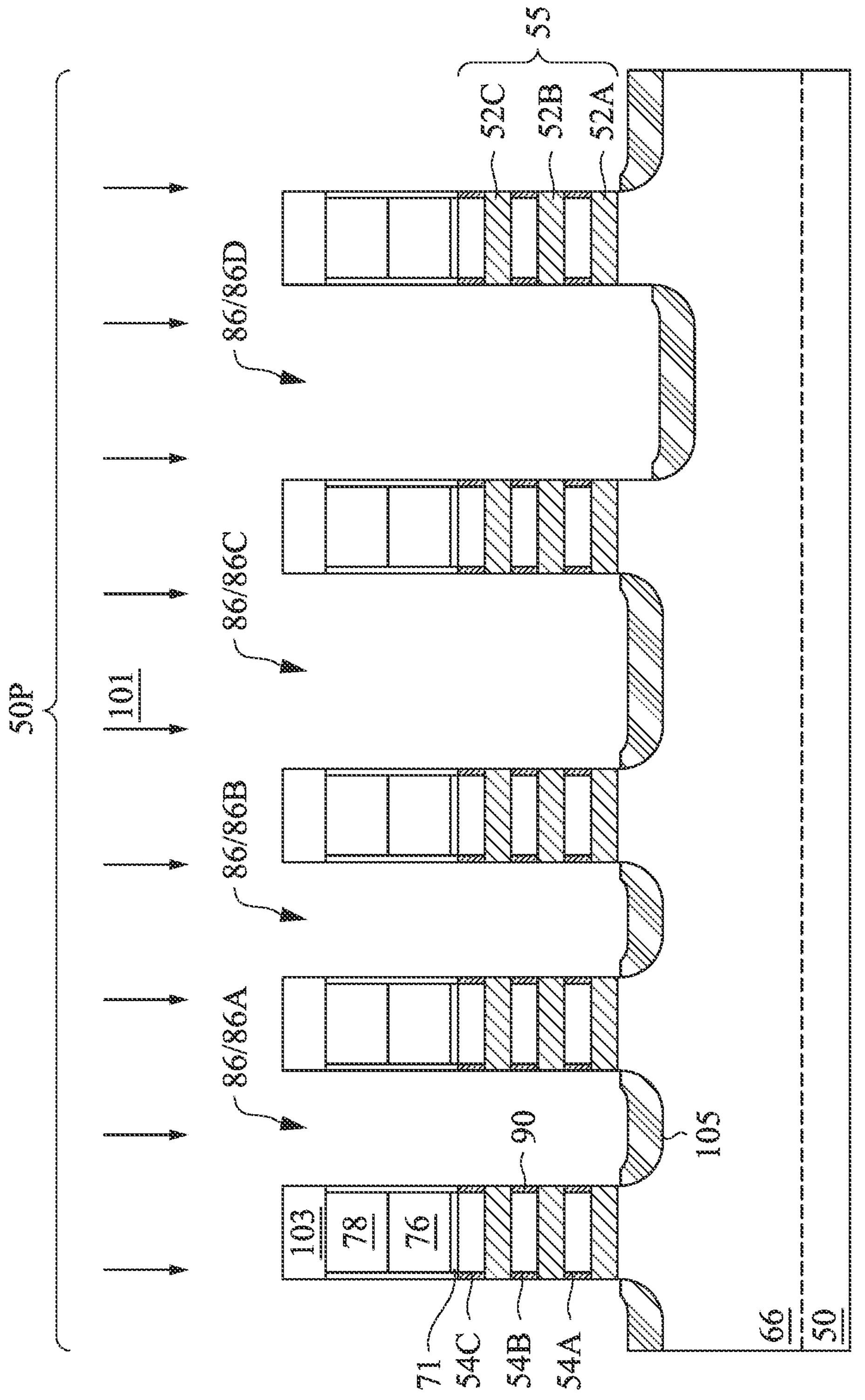

In FIGS. 14A and 14B, the structure of FIGS. 13A and 13B is etched by an etching process 101 to remove the sidewall portions of the dielectric layer 97 to form the dummy gate dielectric cap 103 and the recess dielectric layer 105. (The dummy gate dielectric cap 103 is temporary and will be removed in a subsequent process, described below.) The etching process 101 may be a wet etch using any suitable etchant, such as diluted hydrofluoric acid (DHF). Because of the treatment process 99 providing densification of the horizontal portions of the dielectric layer 97, the ratio of the wet etch rate of the sidewalls to the wet etch rate of the bottom is between about 2:1 and 6:1 (whereas before the treatment process, the ratio of the wet etch rate of the sidewalls to the wet etch rate of the bottom was about 1:1). Thus, minimal material from the bottom of the dielectric layer 97 may be removed while completely removing the sidewalls of the dielectric layer 97, resulting in the formation of the recess dielectric layer 105. For example, the etch loss at the bottom may be about 7 Å for every 15 Å at the sidewalls.

As a result of the deposition process 93 and the treatment process 99, the thicknesses of the recess dielectric layer 105 in each of the recesses 86 have good uniformity regardless of the spacing between dummy gates 76 and regardless of the variations in depth of the recesses 86. For example, in some embodiments, the thicknesses of the recess dielectric layer 105 in each of the recesses 86 may be between about 3 nm and about 4 nm.

Figure 15A:
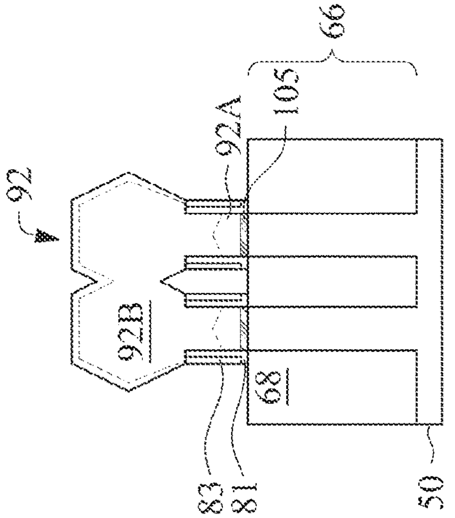
Figure 15B:
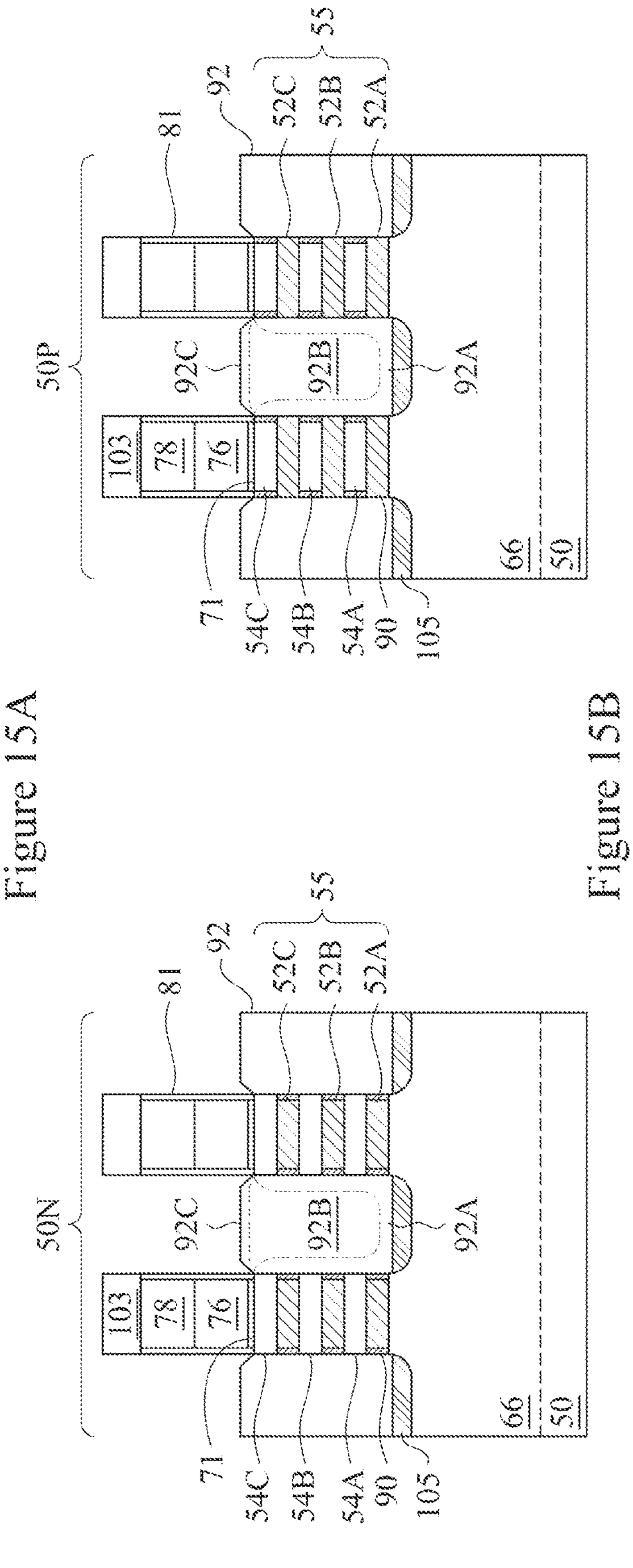

In FIGS. 15A and 15B, epitaxial source/drain regions 92 are formed in the first recesses 86. FIG. 15B includes portions of the structures of FIGS. 14A and 14B combined into a single figure for the purpose of simplification. In some embodiments, the source/drain regions 92 may exert stress on the second nanostructures 54 in the n-type region 50N and on the first nanostructures 52 in the p-type region 50P, thereby improving performance. As illustrated in FIG. 15B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 15A. In other embodiments, adjacent epitaxial source/drain regions 92 remain separated after the epitaxy process is completed. In the embodiments illustrated in FIG. 15A, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 16A:
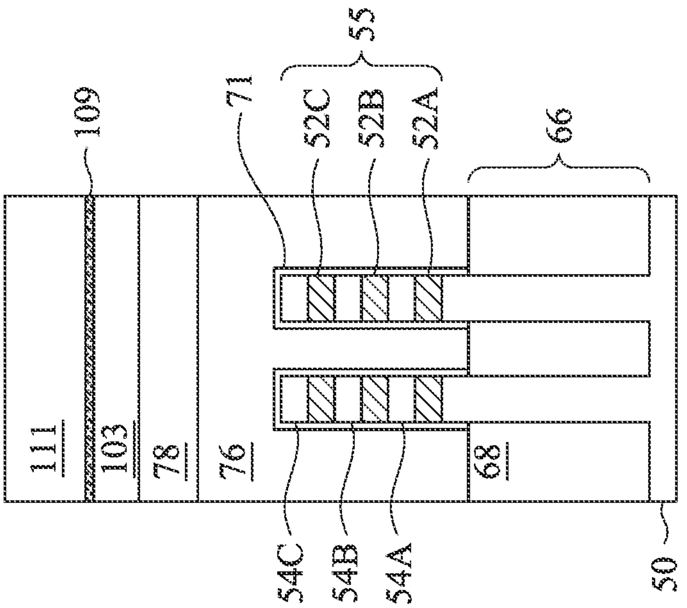
Figure 16B:
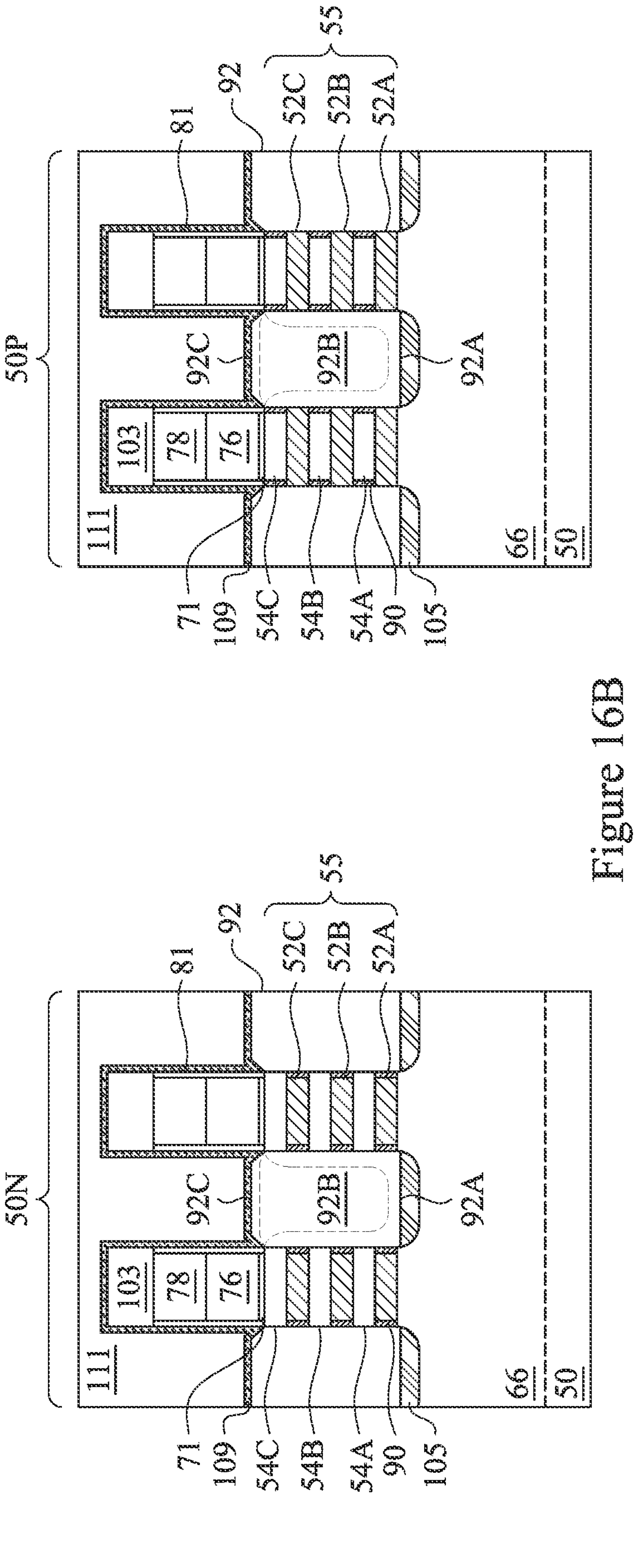
Figure 16C:
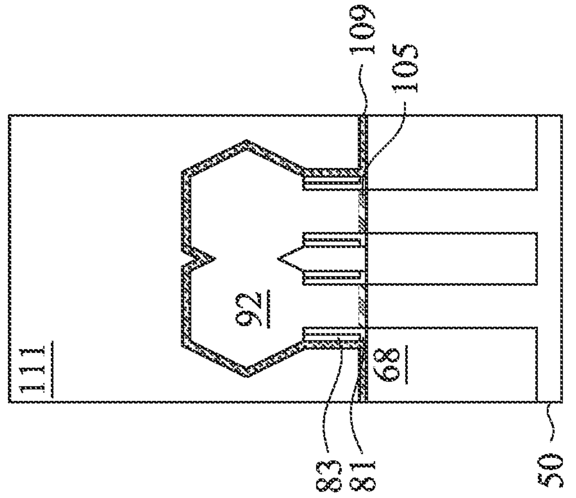

In FIGS. 16A, 16B, and 16C, a first interlayer dielectric (ILD) 111 is deposited over the structure illustrated in FIGS. 6A (as modified to include the dummy gate dielectric cap 103), 15B, and 15A respectively. The first ILD 111 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 109 is disposed between the first ILD 111 and the epitaxial source/drain regions 92, the masks 78, and the first spacers 81. The CESL 109 may comprise a dielectric material, such as, silicon nitride, silicon oxide, silicon oxynitride, or the like, having a different etch rate than the material of the overlying first ILD 111.

Figure 17A:
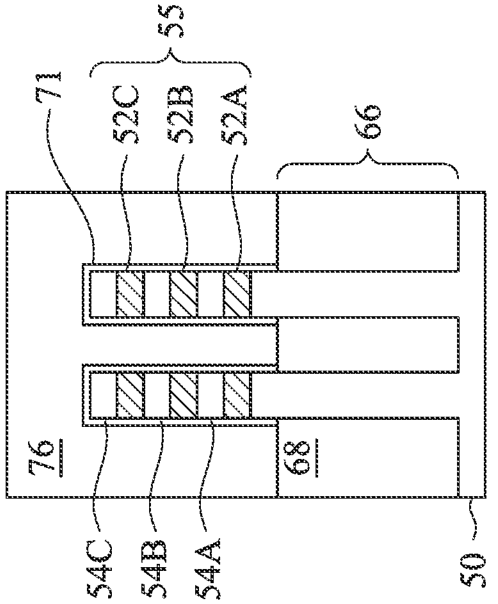
Figure 17B:
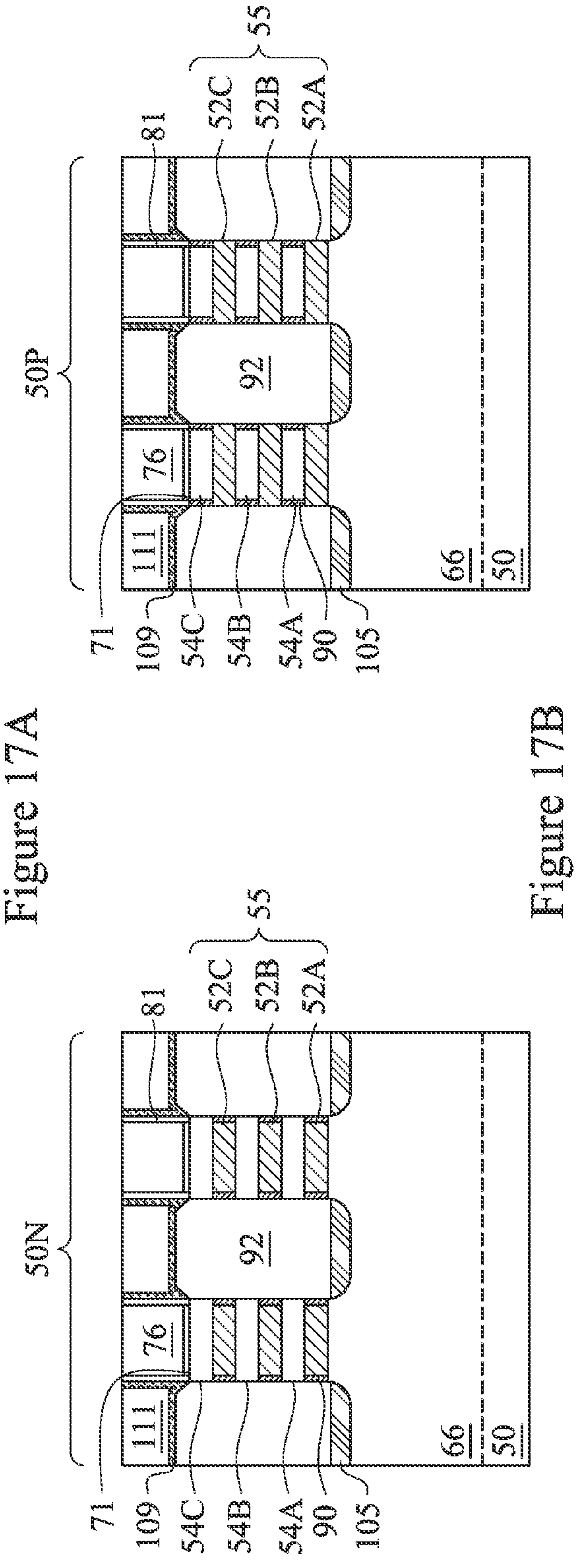

In FIGS. 17A and 17B, a planarization process, such as a CMP, may be performed to level the top surface of the first ILD 111 with the top surfaces of the dummy gates 76 or the masks 78. The planarization process may also remove the dummy gate dielectric cap 103, masks 78 on the dummy gates 76, and portions of the first spacers 81 along sidewalls of the masks 78. After the planarization process, top surfaces of the dummy gates 76, the first spacers 81, and the first ILD 111 are level within process variations. Accordingly, the top surfaces of the dummy gates 76 are exposed through the first ILD 111. In some embodiments, the masks 78 may remain, in which case the planarization process levels the top surface of the first ILD 111 with top surface of the masks 78 and the first spacers 81.

Figure 18A:
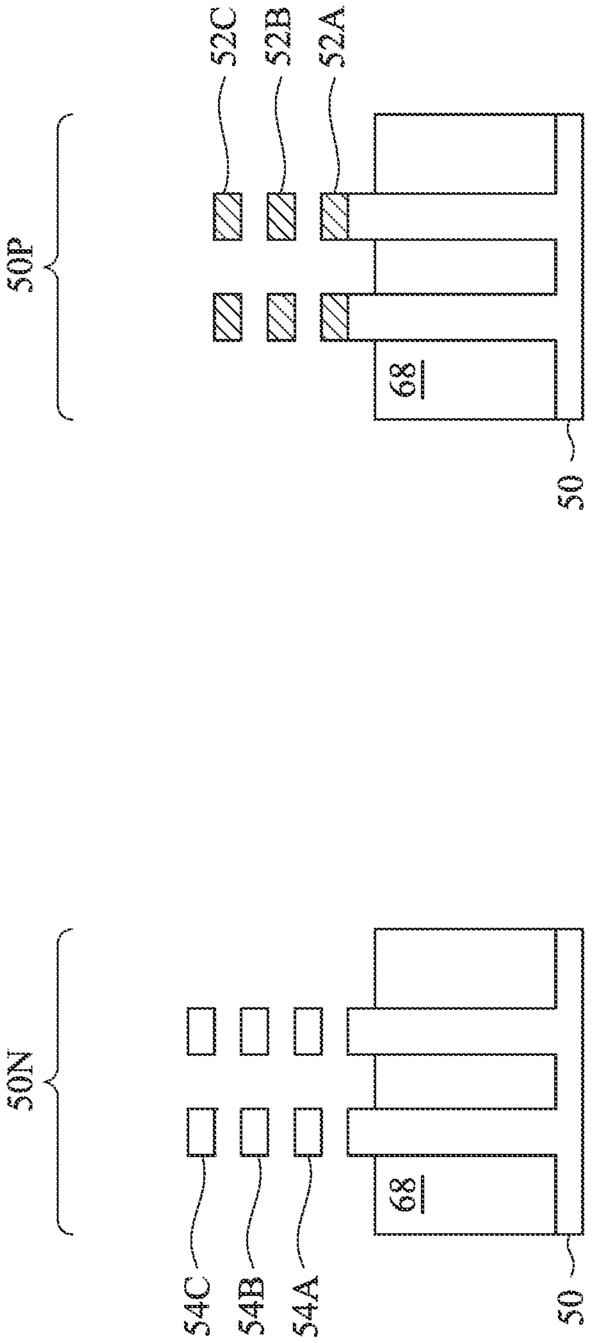
Figure 18B:
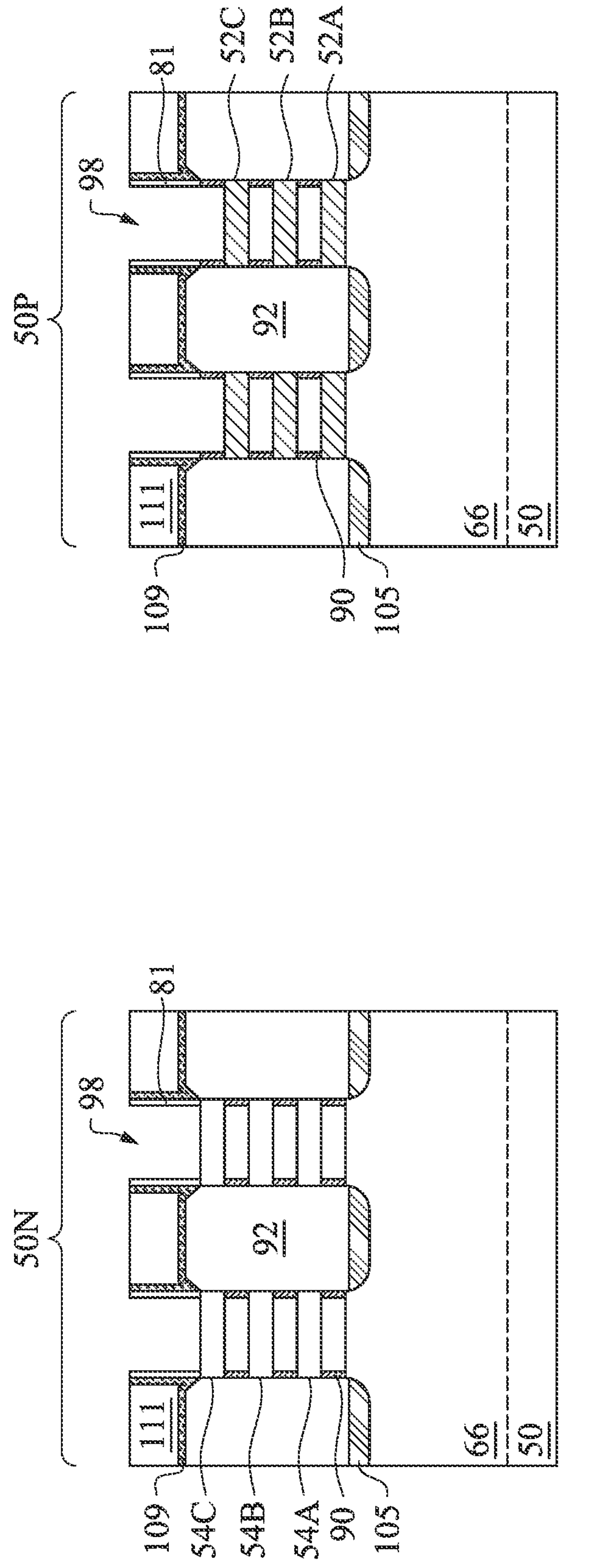

In FIGS. 18A and 18B, the dummy gates 76, and the masks 78 if present, are removed in one or more etching steps, so that second recesses 98 are formed. Portions of the dummy dielectric layers 70 in the second recesses 98 are also removed. In some embodiments, the dummy gates 76 and the dummy dielectric layers 70 are removed by an anisotropic dry etch process. For example, the etching process may include a dry etch process using reaction gas(es) that selectively etch the dummy gates 76 at a faster rate than the first ILD 111 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 70 may be used as etch stop layers when the dummy gates 76 are etched. The dummy dielectric layers 70 may then be removed after the removal of the dummy gates 76.

Then the first nanostructures 52 in the n-type region 50N and the second nanostructures 54 in the p-type region 50P are removed by extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 58 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 21A, 21B, and 21C illustrate a structure resulting from such embodiments where the channel regions in both the p-type region 50P and the n-type region 50N are provided by the second nanostructures 54 and comprise silicon, for example.

Figure 19A:
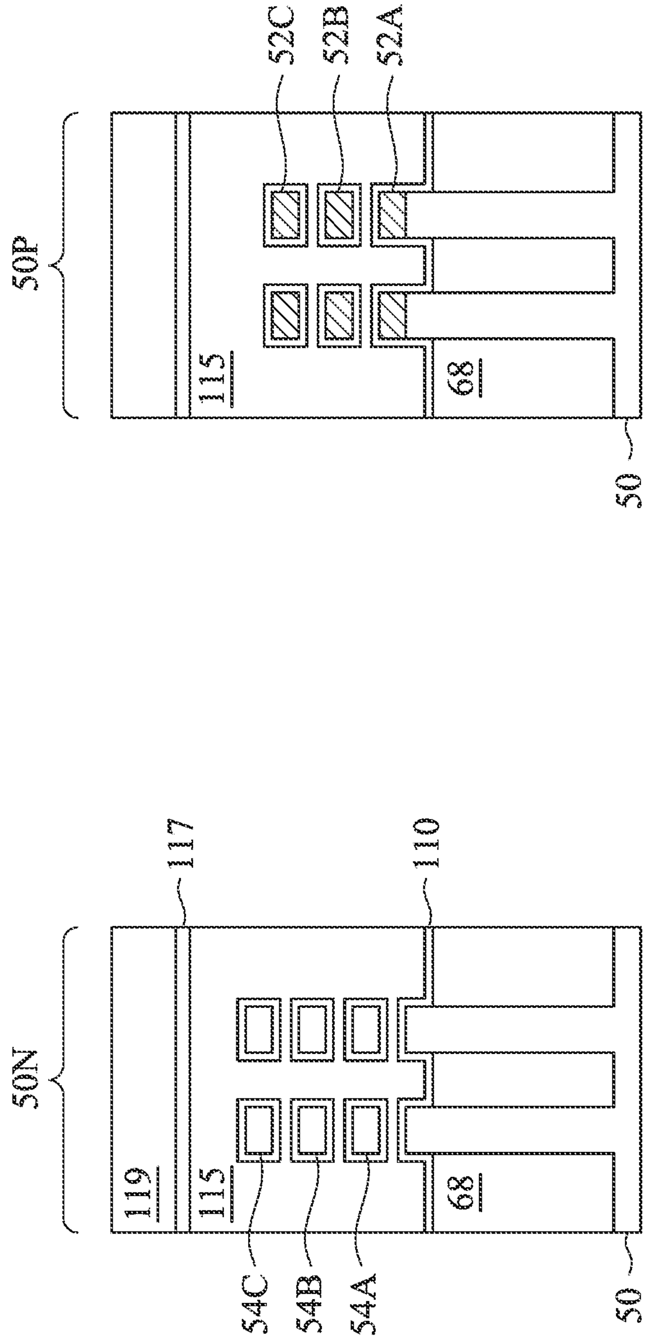
Figure 19B:
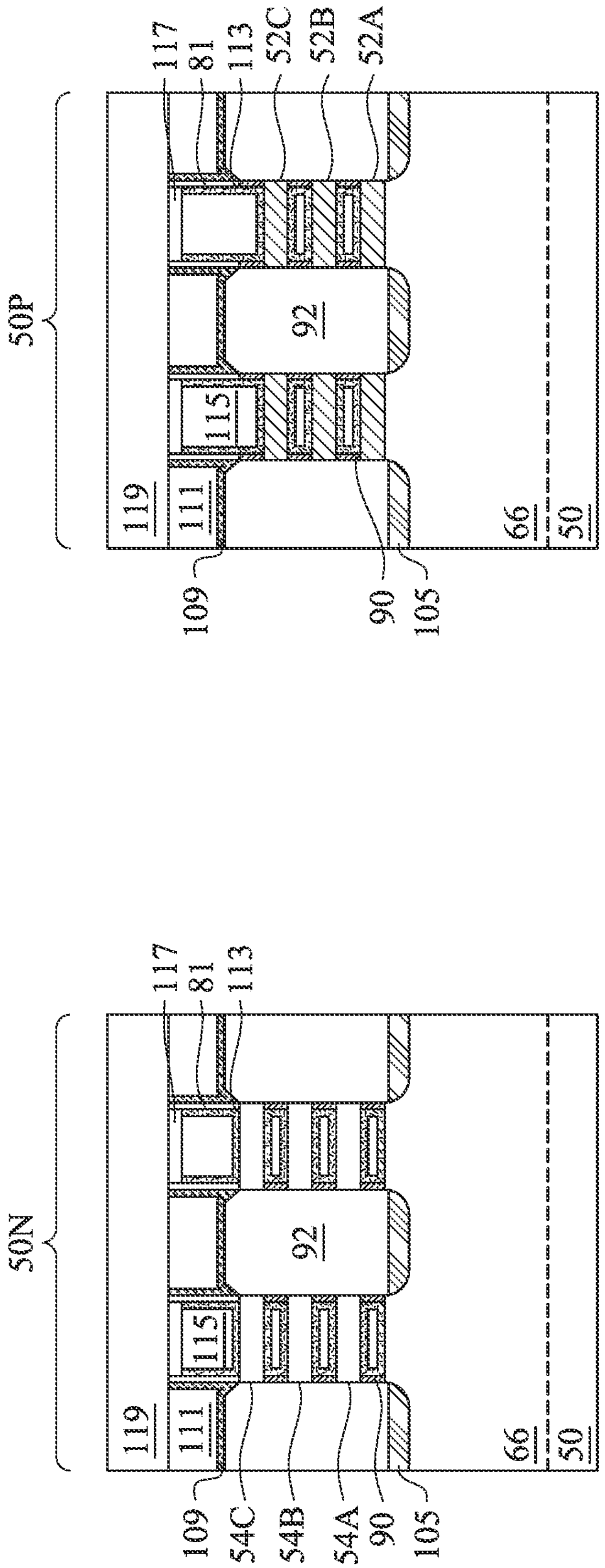
Figure 19C:
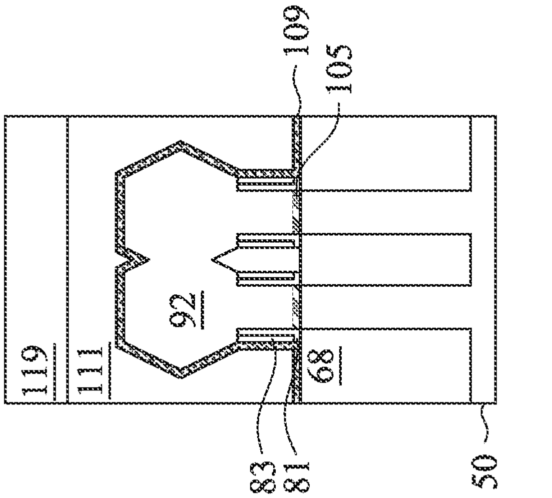

In FIGS. 19A, 19B, and 19C, gate dielectric layers 113 and gate electrodes 115 are formed for replacement gates. The gate dielectric layers 113 are deposited conformally in the second recesses 98. In the n-type region 50N, the gate dielectric layers 113 may be formed on top surfaces and sidewalls of the substrate 50 and on top surfaces, sidewalls, and bottom surfaces of the second nanostructures 54, and in the p-type region 50P, the gate dielectric layers 113 may be formed on top surfaces and sidewalls of the substrate 50 and on top surfaces, sidewalls, and bottom surfaces of the first nanostructures 52. The gate dielectric layers 113 may also be deposited on top surfaces of the first ILD 111, the CESL 109, the first spacers 81, and the STI regions 68.

In accordance with some embodiments, the gate dielectric layers 113 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 113 include a high-k dielectric material, and in these embodiments, the gate dielectric layers 113 may have a k value greater than about 7.0, and may include a metal oxide or a silicate of hafnium, aluminum, zirconium, lanthanum, manganese, barium, titanium, lead, and combinations thereof. The structure of the gate dielectric layers 113 may be the same or different in the n-type region 50N and the p-type region 50P. The formation methods of the gate dielectric layers 113 may include molecular-beam deposition (MBD), ALD, PECVD, and the like.

The gate electrodes 115 are deposited over the gate dielectric layers 113, respectively, and fill the remaining portions of the second recesses 98. The gate electrodes 115 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 115 are illustrated in FIGS. 19A and 19B, the gate electrodes 115 may comprise any number of liner layers, any number of work function tuning layers, and a fill material. Any combination of the layers which make up the gate electrodes 115 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 113 in the n-type region 50N and the p-type region 50P may occur simultaneously such that the gate dielectric layers 113 in each region are formed from the same materials, and the formation of the gate electrodes 115 may occur simultaneously such that the gate electrodes 115 in each region are formed from the same materials. In some embodiments, the gate dielectric layers 113 in each region may be formed by distinct processes, such that the gate dielectric layers 113 may be different materials and/or have a different number of layers, and/or the gate electrodes 115 in each region may be formed by distinct processes, such that the gate electrodes 115 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 113 and the material of the gate electrodes 115, which excess portions are over the top surface of the first ILD 111. The remaining portions of material of the gate electrodes 115 and the gate dielectric layers 113 thus form replacement gate structures of the resulting nano-FETs. The gate electrodes 115 and the gate dielectric layers 113 may be collectively referred to as "gate structures."

The gate structure (including the gate dielectric layers 113 and the corresponding overlying gate electrodes 115) is recessed, so that a recess is formed directly over the gate structure and between opposing portions of first spacers 81. A gate mask 117 comprising one or more layers of dielectric material, such as silicon nitride, silicon oxynitride, or the like, is filled in the recess, followed by a planarization process to remove excess portions of the dielectric material extending over the first ILD 111. Subsequently formed gate contacts (such as the gate contacts 124, discussed below with respect to FIGS. 20A and 20B) penetrate through the gate mask 117 to contact the top surface of the recessed gate electrodes 115.

As further illustrated by FIGS. 19A, 19B, and 19C, a second ILD 119 is deposited over the first ILD 111 and over the gate mask 117. In some embodiments, the second ILD 119 is a flowable film formed by FCVD. In some embodiments, the second ILD 119 is formed of a dielectric material such as PSG, BSG, BPSG, USG, or the like, and may be deposited by any suitable method, such as CVD, PECVD, or the like.

Figure 20A:
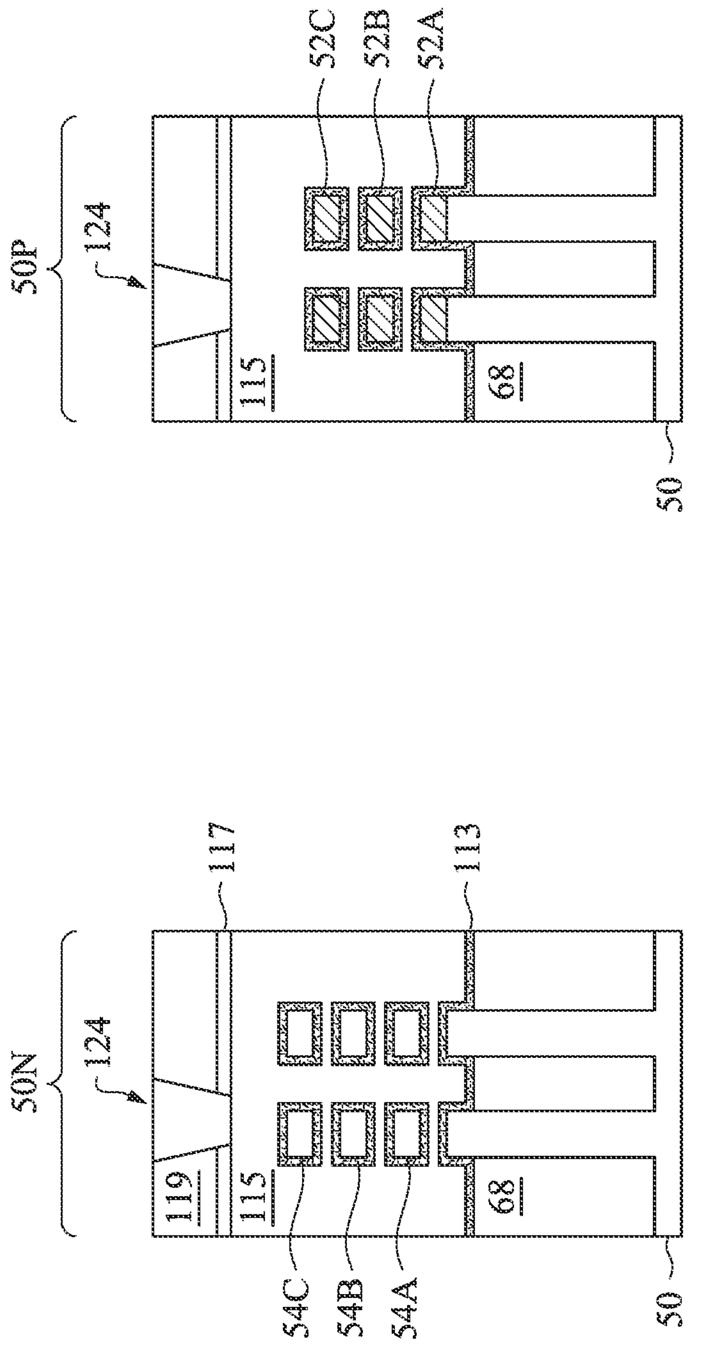
Figure 20B:
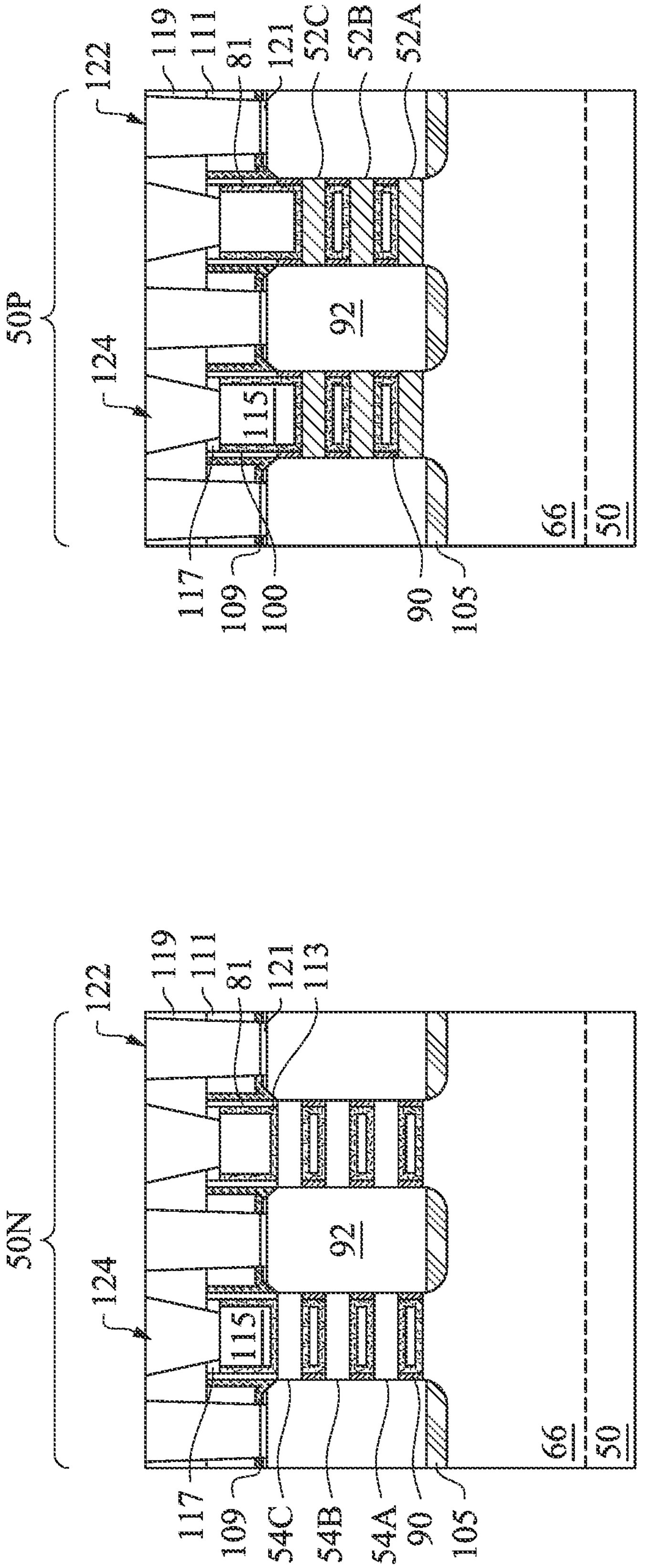
Figure 20C:
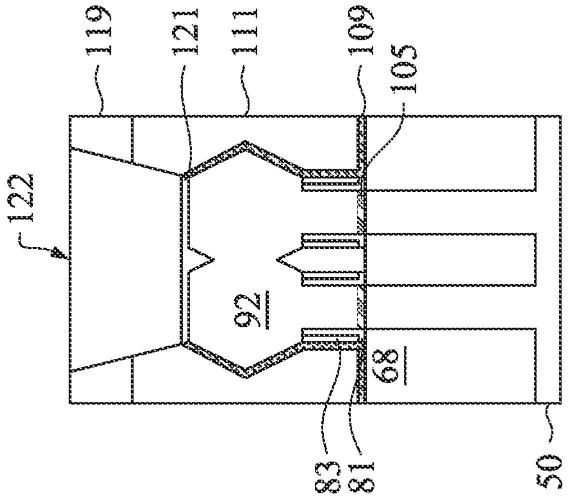

In FIGS. 20A, 20B, and 20C, the second ILD 119, the first ILD 111, the CESL 109, and the gate masks 117 are etched to form third recesses exposing surfaces of the epitaxial source/drain regions 92 and/or the gate structure. The third recesses may be formed by etching using an anisotropic etching process, such as RIE, NBE, or the like. In some embodiments, the third recesses may be etched through the second ILD 119 and the first ILD 111 using a first etching process; may be etched through the gate masks 117 using a second etching process; and may then be etched through the CESL 109 using a third etching process. A mask, such as a photoresist, may be formed and patterned over the second ILD 119 to mask portions of the second ILD 119 from the first etching process and the second etching process. In some embodiments, the etching process may over-etch, and therefore, the third recesses extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 20B illustrates that the third recesses would expose the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts.

After the third recesses are formed, silicide regions 121 are formed over the epitaxial source/drain regions 92. In some embodiments, the silicide regions 121 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 121. The un-reacted portions of the deposited metal are then removed, e.g., by an etching process. Although silicide regions 121 are referred to as silicide regions, silicide regions 121 may also be germanide regions, or silicon germanide regions (e.g., regions comprising silicide and germanide). In an embodiment, the silicide region 121 comprises TiSi, and has a thickness in a range between about 2 nm and about 10 nm.

Next, contacts 122 and 124 (may also be referred to as contact plugs) are formed in the third recesses. The contacts 122 and 124 may each comprise one or more layers, such as barrier layers, diffusion layers, and fill materials. For example, in some embodiments, the contacts 122 and 124 each include a barrier layer 124 and a conductive material 118, and is electrically coupled to the underlying conductive feature (e.g., gate structure 115 and/or silicide region 121 in the illustrated embodiment). The contacts 124 are electrically coupled to the gate structure 115 and may be referred to as gate contacts, and the contacts 122 are electrically coupled to the silicide regions 121 and may be referred to as source/drain contacts. The barrier layer 124 may include titanium, titanium nitride, tantalum, tantalum nitride, or the like. The conductive material 118 may be copper, a copper alloy, silver, gold, tungsten, cobalt, aluminum, nickel, or the like. A planarization process, such as a CMP, may be performed to remove excess material from a surface of the second ILD 119.

FIGS. 21A, 21B, and 21C illustrate cross-sectional views of a device according to some alternative embodiments. FIG. 21A illustrates reference cross-section A-A' illustrated in FIG. 1. FIG. 21B illustrates reference cross-section B-B' illustrated in FIG. 1. FIG. 21C illustrates reference cross-section C-C' illustrated in FIG. 1. In FIGS. 21A, 21B, and 21C, like reference numerals indicate like elements formed by like processes as the structure of FIGS. 20A, 20B, and 20C. However, in FIGS. 21A, 21B, and 21C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 21A, 21B, and 21C may be formed, for example, by removing the first nanostructures 52 from both the p-type region 50P and the n-type region 50N simultaneously; depositing the gate dielectrics 113 and the gate electrodes 115P (e.g., gate electrode suitable for a p-type nano-FET) around the second nanostructures 54 in the p-type region 50P; and depositing the gate dielectrics 113 and the gate electrodes 115N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments have several advantages. For example, utilizing a bottom-up deposition process, such as a PEALD process, a dielectric layer can be deposited at the bottom of a source/drain recess with good uniformity of thicknesses. A treatment process may be used to densify the bottom of the dielectric layer in the source/drain recess to alter the wet etch rate of the bottom of the dielectric layer with respect to the sidewalls of the dielectric layer. The treatment process removes chlorine atoms which are artifacts of the deposition process and replaces them with hydrogen atoms. Altering the wet etch rate provides the ability to perform a wet etch process to remove the sidewall portions of the dielectric layer without significantly removing material from the bottom portions, reducing costs, and reducing process variations overall.

One embodiment is a method including etching a first source/drain recess in a semiconductor fin adjacent a dummy gate, the first source/drain recess exposing side walls of a first nanostructure and a second nanostructure, the first nanostructure over the second nanostructure. The method also includes forming a first sidewall spacer in a sidewall recess of the first nanostructure. The method also includes depositing a first dielectric layer over the dummy gate and in the first source/drain recess, a first portion of the first dielectric layer being a horizontal portion at a bottom of the first source/drain recess, a second portion of the first dielectric layer being a vertical portion on a sidewall of the first source/drain recess, the first portion and the second portion of the first dielectric layer having an etch rate that is uniform. The method also includes performing a treatment process on the first dielectric layer, the treatment process modifying the etch rate of the first dielectric layer so that the first portion of the first dielectric layer has a different etch rate than the second portion of the first dielectric layer. The method also includes performing a wet etch of the first dielectric layer, the wet etch removing the second portion of the first dielectric layer at a greater rate than the first portion of the first dielectric layer.

Another embodiment is a method including providing a precursor gas to a first recess of a workpiece. The method also includes generating a first plasma from a reactive gas and providing the first plasma to the first recess of the workpiece, the first plasma reacting with the precursor gas to form a deposition layer. The method also includes treating the deposition layer by generating a second plasma from a treatment gas and providing the second plasma to the first recess of the workpiece, the second plasma altering an etch rate selectivity of a horizontal portion of the deposition layer in the first recess. The method also includes etching the deposition layer in the first recess to remove a vertical portion of the deposition layer, where an etch rate of the horizontal portion of the deposition layer is less than an etch rate of the vertical portion of the deposition layer.

Another embodiment is a method including depositing a first dielectric layer in a first recess of a semiconductor fin, the first recess exposing a first nanostructure and a second nanostructure, the first dielectric layer having a sidewall portion extending from a top of a gate structure alongside of the gate structure and into a side of the first recess, the first dielectric layer having a bottom portion at a bottom of the first recess, the bottom portion having a greater top-to-bottom thickness than a side-to-side thickness of the sidewall portion. The method also includes treating the first dielectric layer with a plasma gas treatment, the plasma gas treatment causing an etch selectivity to a first etchant to change for the bottom portion. The method also includes etching the first dielectric layer by the first etchant, the etching removing the sidewall portion of the first dielectric layer at a greater etch rate than the bottom portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

etching a first source/drain recess in a semiconductor fin adjacent a dummy gate, the first source/drain recess exposing sidewalls of a first nanostructure and a second nanostructure, the first nanostructure over the second nanostructure;

forming a first sidewall spacer in a sidewall recess of the first nanostructure;

depositing a first dielectric layer over the dummy gate and in the first source/drain recess, a first portion of the first dielectric layer being a horizontal portion at a bottom of the first source/drain recess, a second portion of the first dielectric layer being a vertical portion on a sidewall of the first source/drain recess, the first portion and the second portion of the first dielectric layer having an etch rate that is uniform;

performing a treatment process on the first dielectric layer, wherein the treatment process comprises exposing the first dielectric layer to a plasma treatment, the treatment process modifying the etch rate of the first dielectric layer so that the first portion of the first dielectric layer has a different etch rate than the second portion of the first dielectric layer, wherein the plasma treatment removes a larger percentage of chlorine atoms from the first portion of the first dielectric layer than the second portion of the first dielectric layer, a percentage of chlorine atoms in the first portion being between 0.3% and 0.5% post plasma treatment, and a percentage of the chlorine atoms in the second portion being between 0.6% and 0.8% post plasma treatment; and performing a wet etch of the first dielectric layer, the wet etch removing the second portion of the first dielectric layer at a greater rate than the first portion of the first dielectric layer.

2. The method of claim 1, wherein depositing the first dielectric layer comprises:

supplying a precursor gas to the bottom of the first source/drain recess; and reacting the precursor gas with a reactant plasma.

3. The method of claim 2, wherein the precursor gas comprises: DCS, PCDS, HCDS, HCDS and methylamine, or diiodosilane.

4. The method of claim 2, wherein the reactant plasma is ignited from nitrogen, ammonia, nitrogen and ammonia, nitrogen and hydrogen, nitrogen and argon, ammonia and argon, ammonia and hydrogen, or nitrogen, ammonia, nitrogen, and hydrogen.

5. The method of claim 1, wherein after performing the treatment process and prior to performing the wet etch, a percentage difference of chlorine between the second portion of the first dielectric layer and the first portion of the first dielectric layer is 0.2% to 0.5%.

6. The method of claim 1, wherein prior to performing the treatment process, a first ratio of a wet etch rate of the second portion of the first dielectric layer to the first portion of the first dielectric layer is 1:1, wherein after performing the treatment process, a second ratio of a wet etch rate of the second portion of the first dielectric layer to the first portion of the first dielectric layer is between 2:1 and 6:1.

7. A method comprising:

etching a first source/drain recess in a semiconductor fin adjacent a dummy gate, the first source/drain recess exposing sidewalls of a first nanostructure and a second nanostructure, the first nanostructure over the second nanostructure;

forming a first sidewall spacer in a sidewall recess of the first nanostructure;

depositing a first dielectric layer over the dummy gate and in the first source/drain recess, a first portion of the first dielectric layer being a horizontal portion at a bottom of the first source/drain recess, a second portion of the first dielectric layer being a vertical portion on a sidewall of the first source/drain recess, the first portion and the second portion of the first dielectric layer having an etch rate that is uniform;

performing a treatment process on the first dielectric layer, wherein the treatment process comprises exposing the first dielectric layer to a plasma treatment, the treatment process modifying the etch rate of the first dielectric layer so that the first portion of the first dielectric layer has a different etch rate than the second portion of the first dielectric layer, wherein the plasma treatment removes a larger percentage of chlorine atoms from the first portion of the first dielectric layer than the second portion of the first dielectric layer; and performing a wet etch of the first dielectric layer, the wet etch removing the second portion of the first dielectric layer at a greater rate than the first portion of the first dielectric layer.

8. The method of claim 7, wherein depositing the first dielectric layer comprises:

supplying a precursor gas to the bottom of the first source/drain recess; and reacting the precursor gas with a reactant plasma.

9. The method of claim 8, wherein the precursor gas comprises: DCS, PCDS, HCDS, HCDS and methylamine, or diiodosilane.

10. The method of claim 8, wherein the precursor gas includes a nitrogen-based chlorine containing gas.

11. The method of claim 8, wherein the reactant plasma is ignited from nitrogen, ammonia, nitrogen and ammonia, nitrogen and hydrogen, nitrogen and argon, ammonia and argon, ammonia and hydrogen, or nitrogen, ammonia, nitrogen, and hydrogen.

12. The method of claim 7, wherein after performing the treatment process and prior to performing the wet etch, a percentage difference of chlorine between the second portion of the first dielectric layer and the first portion of the first dielectric layer is 0.2% to 0.5%.

13. The method of claim 7, wherein prior to performing the treatment process, a first ratio of a wet etch rate of the second portion of the first dielectric layer to the first portion of the first dielectric layer is 1:1, wherein after performing the treatment process, a second ratio of a wet etch rate of the second portion of the first dielectric layer to the first portion of the first dielectric layer is between 2:1 and 6:1.

14. The method of claim 7, wherein the plasma treatment causes chlorine atoms to be substituted for hydrogen atoms.

15. The method of claim 7, wherein the plasma treatment densifies the first portion of the first dielectric layer.

16. A method comprising:

etching a first source/drain recess in a semiconductor fin adjacent a dummy gate, the first source/drain recess exposing sidewalls of a first nanostructure and a second nanostructure, the first nanostructure over the second nanostructure;

forming a first sidewall spacer in a sidewall recess of the first nanostructure;

depositing a first dielectric layer over the dummy gate and in the first source/drain recess, a first portion of the first dielectric layer being a horizontal portion at a bottom of the first source/drain recess, a second portion of the first dielectric layer being a vertical portion on a sidewall of the first source/drain recess, the first portion and the second portion of the first dielectric layer having an etch rate that is uniform;

performing a treatment process on the first dielectric layer, wherein the treatment process comprises exposing the first dielectric layer to a plasma treatment, the treatment process modifying the etch rate of the first dielectric layer so that the first portion of the first dielectric layer has a different etch rate than the second portion of the first dielectric layer, wherein the plasma treatment removes a larger percentage of chlorine atoms from the first portion of the first dielectric layer than the second portion of the first dielectric layer, wherein the plasma treatment causes chlorine atoms in the first dielectric layer to be substituted for hydrogen atoms; and performing a wet etch of the first dielectric layer, the wet etch removing the second portion of the first dielectric layer at a greater rate than the first portion of the first dielectric layer.

17. The method of claim 16, wherein depositing the first dielectric layer comprises:

supplying a precursor gas to the bottom of the first source/drain recess; and reacting the precursor gas with a reactant plasma.

18. The method of claim 17, wherein the precursor gas includes a nitrogen-based chlorine containing gas.

19. The method of claim 16, wherein after performing the treatment process and prior to performing the wet etch, a percentage difference of chlorine between the second portion of the first dielectric layer and the first portion of the first dielectric layer is 0.2% to 0.5%.

20. The method of claim 16, wherein prior to performing the treatment process, a first ratio of a wet etch rate of the second portion of the first dielectric layer to the first portion of the first dielectric layer is 1:1, wherein after performing the treatment process, a second ratio of a wet etch rate of the second portion of the first dielectric layer to the first portion of the first dielectric layer is between 2:1 and 6:1.

* * * * *